(12) United States Patent
Kwak et al.

(10) Patent No.: US 8,809,993 B2
(45) Date of Patent: Aug. 19, 2014

(54) SEMICONDUCTOR DEVICE HAVING ISOLATION REGION

(71) Applicant: Samsung Electronics Co., Ltd., Suwon-si (KR)

(72) Inventors: Sei-lyn Kwak, Goyang-si (KR); Se-myeong Jang, Anyang-si (KR); Min-sung Kang, Yongin-si (KR); Yun-jae Lee, Seoul (KR); Hyeon-kyu Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/772,775

(22) Filed: Feb. 21, 2013

(65) Prior Publication Data

US 2013/0241027 A1    Sep. 19, 2013

(30) Foreign Application Priority Data

Mar. 19, 2012    (KR) ......................... 10-2012-0027755

(51) Int. Cl.
     *H01L 29/00*      (2006.01)

(52) U.S. Cl.
     USPC ........................................ 257/506; 257/499

(58) Field of Classification Search
     USPC ................................................ 257/499, 506
     See application file for complete search history.

(56) References Cited

U.S. PATENT DOCUMENTS

| | | | |
|---|---|---|---|
| 7,217,634 B2 | 5/2007 | Zhang | |
| 7,648,869 B2 * | 1/2010 | Chang et al. | 438/199 |
| 7,960,998 B2 * | 6/2011 | Rozario et al. | 324/762.09 |
| 7,977,731 B2 * | 7/2011 | Asada et al. | 257/321 |
| 8,030,157 B1 * | 10/2011 | Hichri et al. | 438/248 |
| 2004/0087106 A1 | 5/2004 | Kim | |
| 2005/0064678 A1 | 3/2005 | Dudek et al. | |
| 2010/0252905 A1 | 10/2010 | Hoilien | |

FOREIGN PATENT DOCUMENTS

| | | |
|---|---|---|
| KR | 1020030000675 | 1/2003 |
| KR | 1020060002057 | 1/2006 |
| KR | 1020060066928 | 6/2006 |
| KR | 1020070068648 | 7/2007 |
| KR | 1020070077391 | 7/2007 |

* cited by examiner

*Primary Examiner* — Thanh V Pham

(74) *Attorney, Agent, or Firm* — Myers Bigel Sibley & Sajovec, P.A.

(57) ABSTRACT

A semiconductor device can include an isolation region that defines a plurality of active regions. The plurality of active regions can include an upper surface having a short axis in a first direction and a long axis in a second direction. The plurality of active regions can be repeatedly disposed along the first direction and along the second direction, and can be spaced apart from each other. The isolation region can include a first insulating layer being in contact with side walls of a short axis pair of active regions which can be the closest active regions in the first direction among the plurality of active regions, and continuously extending along a first shortest distance between the short axis pair of active regions.

20 Claims, 20 Drawing Sheets

SEMICONDUCTOR DEVICE HAVING ISOLATION REGION

CROSS-REFERENCE TO RELATED APPLICATIONS

This application claims the benefit of Korean Patent Application No. 10-2012-0027755, filed on Mar. 19, 2012, in the Korean Intellectual Property Office, the disclosure of which is incorporated herein in its entirety by reference.

BACKGROUND

The inventive concept relates to a semiconductor device and a method of manufacturing the same, and more particularly, to a semiconductor device including an isolation region.

As the integration of semiconductor devices increases, individual unit devices constituting a semiconductor device are more closely disposed. Thus, an isolation region for electrical separation between the unit devices plays a more important role. However, as the feature size of semiconductor devices is reduced, the sizes of active regions of a semiconductor device and an isolation region defining the active regions may also be reduced. Thus, there is a need to develop a technique for preventing electrical characteristics from deteriorating and maintaining the reliability in a fine semiconductor device.

SUMMARY

In some embodiments according to the inventive concept, a semiconductor device can include an isolation region that defines a plurality of active regions. The plurality of active regions can include an upper surface having a short axis in a first direction and a long axis in a second direction. The plurality of active regions can be repeatedly disposed along the first direction and along the second direction, and can be spaced apart from each other. The isolation region can include a first insulating layer being in contact with side walls of a short axis pair of active regions which can be the closest active regions in the first direction among the plurality of active regions, and continuously extending along a first shortest distance between the short axis pair of active regions.

The first insulating layer may contact side walls of a long axis pair of active regions which are closest active regions in the second direction among the plurality of active regions, and continuously extend along a second shortest distance between the long axis pair of active regions.

The isolation region may be the first insulating layer.

The first insulating layer may contact side walls of a long axis pair of active regions which are closest active regions in the second direction among the plurality of active regions, and covers the side walls of the long axis pair of active regions by a first width in a second shortest distance between the long axis active regions, and the first shortest distance may be equal to or less than twice the first width, and the second shortest distance may be greater than twice the first width. The isolation region further may include a second insulating layer having side walls and a lower surface, and being disposed in the second shortest distance, the side walls and a lower surface being surrounded by the first insulating layer.

The short axis pair of active regions may be aligned to be shifted to the opposite directions along the second direction such that portions of the pair of first active regions overlap with each other along the first direction, and the second insulating layer is not disposed between the short axis pair of active regions.

The second insulating layer may have a solid pillar shape filled with the same material as that forming the external surface of the second insulating layer.

The semiconductor device may further include: a word line extending to cross the second shortest distance; and a gate dielectric film being interposed between the word line and the plurality of active regions, wherein the second insulating layer faces a lower surface of the word line with the gate dielectric film interposed between the second insulating layer and the word line.

According to another aspect of the inventive concept, there is provided a semiconductor device including: a substrate including a first region and second region having different active region densities from each other, a plurality of first active regions in the first region, the plurality of first active regions including an upper surface having a short axis in a first direction and a long axis in a second direction, being repeatedly disposed along the first direction and along the second direction, and being spaced apart from each other, a plurality of second active regions in the second region, a first isolation region defining the plurality of first active regions in the first region, and a second isolation region defining the plurality of second active regions in the second region, wherein the first isolation region includes a first insulating layer being in contact with side walls of a short axis pair of first active regions which are closest first active regions in the first direction among the plurality of first active regions, and continuously extending along a first shortest distance between the short axis pair of first active regions, and the second isolation region includes a trench insulating layer covering side walls of the plurality of second active regions, an insulating liner covering the trench insulating layer, and a gap-fill insulating layer on the insulating liner.

In some embodiments according to the inventive concept, a semiconductor device can include a substrate including a trench isolation material therein in a cell array region of the device and in a peripheral/core region of the device. A plurality of active regions can be spaced apart from one another in the substrate and can be separated from one another by the trench isolation material, where each active region can have opposite short axis side walls and opposite long axis side walls, where the closest portions of facing long axis side walls of directly adjacent ones of the active regions can directly contact the trench isolation material and wherein the peripheral/core region can include the trench isolation material with a trench isolation liner material thereon.

In some embodiments according to the inventive concept, closest portions of facing short axis side walls of directly adjacent ones of the active regions can directly contact the trench isolation material and can be separated from one another by a trench liner material surrounded by the trench isolation material contacting the facing short axis side walls.

In some embodiments according to the inventive concept, the trench isolation material can be an oxide material and the trench liner material can be a nitride material. In some embodiments according to the inventive concept, the trench isolation material in the peripheral/core region can be an oxide material and the trench isolation liner material can be SiN material, where the peripheral/core region further include a Tonen SilaZene structure on the trench isolation liner material opposite the oxide material, where a total thickness of the SiN material can be greater than a total thickness of the oxide material.

In some embodiments according to the inventive concept, the trench isolation material in the peripheral/core region can be an oxide material having a total thickness that is greater than half a distance separating directly adjacent facing long axis side walls of the plurality of active regions.

DETAILED DESCRIPTION OF THE EMBODIMENTS

Figure 1A:
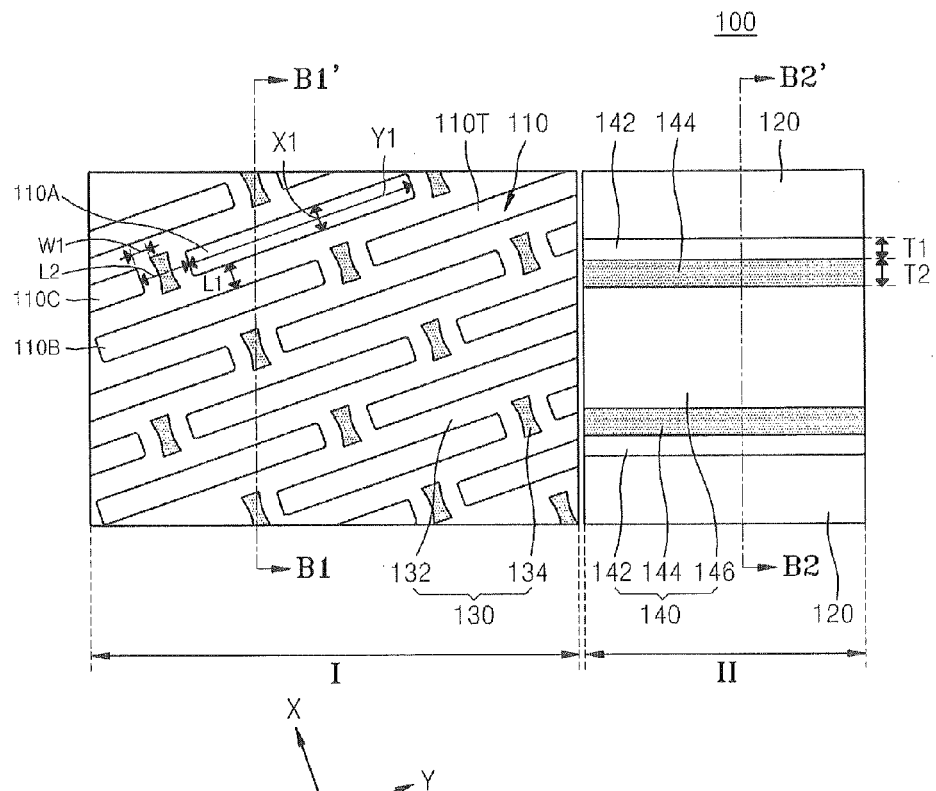
FIG. 1A is a plan view of a semiconductor device according to an embodiment of the inventive concept.

Hereinafter, the inventive concept will be described more fully with reference to the accompanying drawings, in which exemplary embodiments of the inventive concept are shown. Like reference numerals in the drawings denote like elements, and thus, their description will be omitted.

The inventive concept may, however, be embodied in many different forms and should not be construed as being limited to the embodiments set forth herein; rather, these embodiments are provided so that this disclosure will be thorough and complete, and will fully convey the inventive concept to one of ordinary skill in the art.

It will be understood that, although the terms 'first', 'second', 'third', etc., may be used herein to describe various elements, regions, layers, sections, and/or components, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept. For example, a first component discussed below could be termed a second component, and similarly, a second component may be termed a first component without departing from the teachings of this disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concept is not limited to the described order of the operations. For example, operations consecutively described herein may be simultaneously performed in practice, or may be executed in the opposite order to the described order.

As such, variations from the shapes of the illustrations as a result, for example, of manufacturing techniques and/or tolerances, are to be expected.

Thus, embodiments of the inventive concept should not be construed as being limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

Figure 1B:
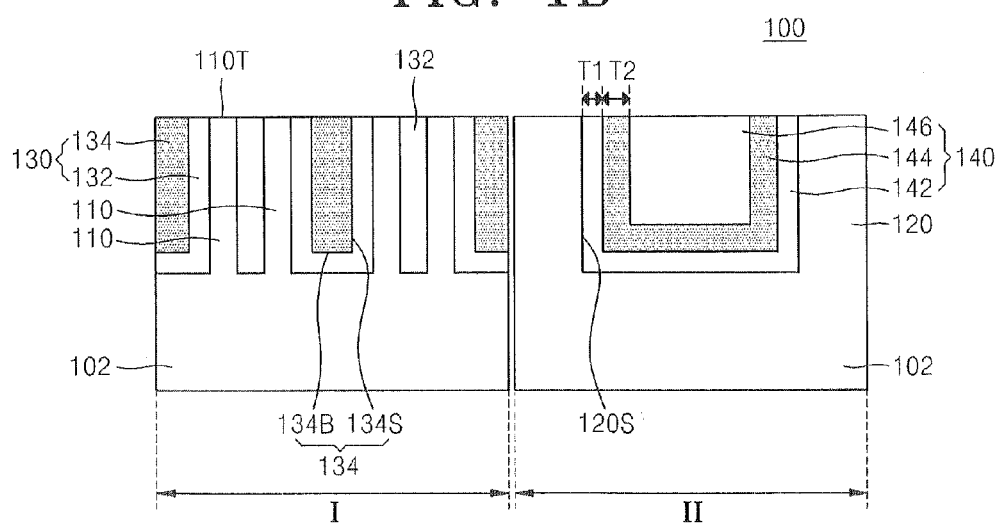
FIG. 1B shows a cross-sectional view taken along lines B1-B1' and B2-B2' of FIG. 1A.

FIG. 1A is a plan view of a semiconductor device 100 according to an embodiment of the inventive concept. FIG. 1B shows a cross-sectional view taken along lines B1-B1' and B2-B2' of FIG. 1A.

Referring to FIGS. 1A and 1B, the semiconductor device 100 includes a substrate 102 having a first region I and a second region II that include active regions formed at different densities. The substrate 102 may be a semiconductor substrate, for example, a silicon wafer. The active regions of the first region I are formed at a relatively high density in the substrate 102, and the active regions of the second region II are formed at a relatively low density (compared to those in the first region) in the substrate 102. For example, the first region I may be a portion of a cell array of a semiconductor memory device, and the second region II may be a portion of a core region or a peripheral circuit region.

In the first region I of the substrate 102, a plurality of first active regions 110 are defined by a first isolation region 130.

Each of the plurality of first active regions 110 has an upper surface 110T that has a short axis X1 in a first direction (X direction in FIG. 1A) and a long axis Y1 in a second direction (Y direction in FIG. 1A). It will be understood that the terms "long" and "short" are used herein to refer to their respective lengths when compared to each other. The plurality of first active regions 110 are repeatedly disposed apart from each other in the first direction (X direction in FIG. 1A) and the second direction (Y direction in FIG. 1A).

Among the plurality of first active regions 110, a short axis pair of first active regions 110A and 110B, which are closest to each other in the first direction (X direction in FIG. 1A), are spaced apart from each other by a first shortest distance L1. In addition, among the plurality of first active regions 110, a long axis pair of active regions 110A and 110C, which are closest to each other in the second direction, (Y direction in FIG. 1A) are spaced apart from each other by a second shortest distance L2. According to an embodiment, the second shortest distance L2 is greater than the first shortest distance L1.

The short axis pair of first active regions 110A and 110B are offset in the second direction (Y direction in FIG. 1A) such that portions of the short axis first active regions 110A and 110B overlap with each other in the first direction (X direction in FIG. 1A).

The first isolation region 130 includes a first insulating layer 132 and a plurality of second insulating layers 134.

The first insulating layer 132 continuously extends along the first shortest distance L1 between the short axis pair of first active regions 110A and 110B while being in contact with side walls of the short axis pair of first active regions 110A and 110B.

The first insulating layer 132 covers side walls of the long axis pair of active regions 110A and 110C with a first width W1 in the second shortest distance L2 while being in contact with the side walls of the long axis pair of active regions 110A and 110C. According to an embodiment, the first shortest distance L1 is equal to or less than twice the first width W1 (L1≤2*W1), and the second shortest distance L2 is greater than twice the first width W1 (L2>2*W1).

The plurality of second insulating layers 134 are spaced apart from the plurality of first active regions 110 by the first width W1 of the first insulating layer 132 and disposed between the long axis pair of active regions 110A and 110C. The plurality of second insulating layers 134 have side walls 134S and a lower surface 134B surrounded by the first insulating layer 132. According to an embodiment, the plurality of second insulating layers 134 are not formed between the short axis pair of first active regions 110A and 110B. According to an embodiment, the plurality of second insulating layers 134 have a solid pillar shape filled with the same material as that forming its external surface.

FIGS. 1A and 1B show an exemplary first isolation region 130 only including the first insulating layer 132 and the plurality of second insulating layers 134. However, the inventive concept is not limited thereto, and the first isolation region 130 may further include another component different from the first insulating layer 132 and the second insulating layers 134. According to an embodiment, the first isolation region 130 may include void regions formed in and/or near at least one of the first insulating layer 132 and the plurality of second insulating layers 134.

In the second region II of the substrate 102, a plurality of second active regions 120 are defined by a second isolation region 140.

The second isolation region 140 includes a trench insulating layer 142 that covers side walls 120S of the plurality of second active regions 120, an insulating liner 144 that covers the trench insulating layer 142, and a gap-fill insulating layer 146 that is formed on the insulating liner 144.

A thickness T1 of the trench insulating layer 142 in the second region II is equal to or greater than ½ of the first shortest distance L1 in the first region I (0.5*L1≤T1). A thickness T2 of the insulating liner 144 in the second region II is greater than the thickness T1 of the trench insulating layer 142 (T1<T2).

The first insulating layer 132 in the first region I is formed of the same material as the trench insulating layer 142 in the second region II. The plurality of second insulating layers 134 of the first region I are formed of the same material as the insulating liner 144 of the second region II.

In some embodiment, the first insulating layer 132, the trench insulating layer 142, and the gap-fill insulating layer 146 are oxide layers, and the plurality of second insulating layers 134 and the insulating liner 144 are nitride layers.

Figure 2A:
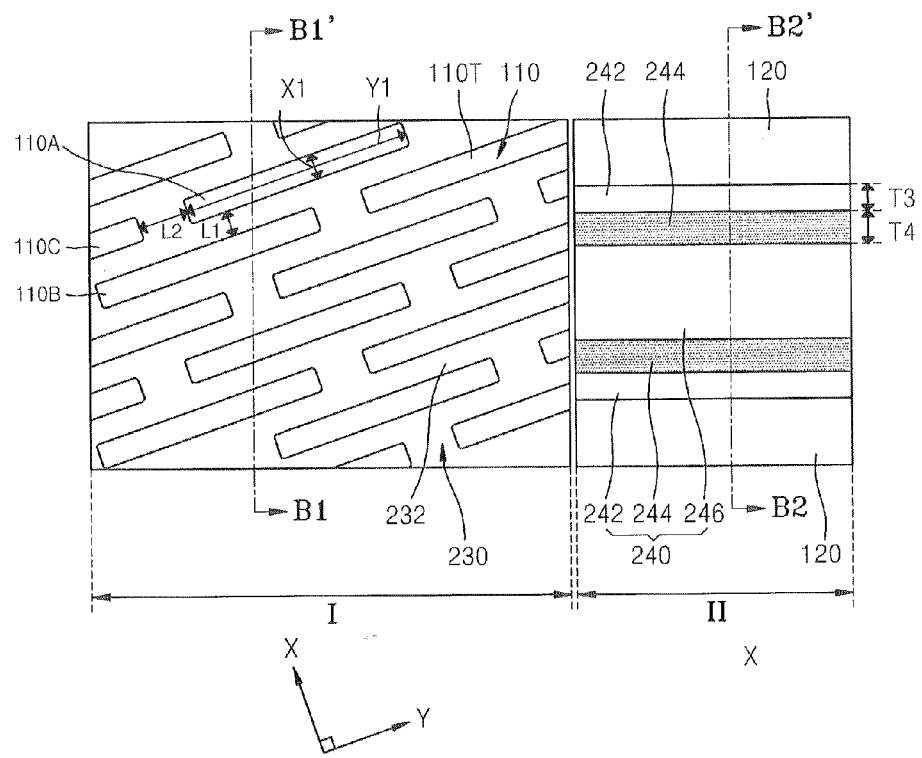
FIG. 2A is a plan view of a semiconductor device according to an embodiment of the inventive concept.
Figure 2B:
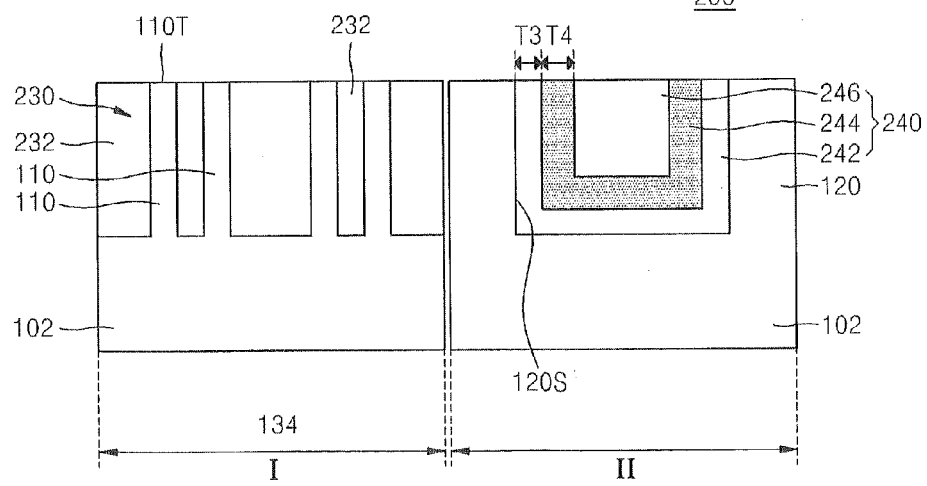
FIG. 2B shows a cross-sectional view taken along lines B1-B1' and B2-B2' of FIG. 2A.

FIG. 2A is a plan view of a semiconductor device 200 according to an embodiment of the inventive concept. FIG. 2B shows a cross-sectional view taken along lines B1-B1' and B2-B2' of FIG. 2A. The same reference numerals in FIGS. 2A and 2B as those in FIGS. 1A and 1B denote the same elements.

Referring to FIGS. 2A and 2B, a plurality of first active regions 110 are defined by a first isolation region 230 in the first region I of the substrate 102.

The first isolation region 230 includes a first insulating layer 232.

The first insulating layer 232 continuously extends along the first shortest distance L1 between the short axis pair of first active regions 110A and 110B while being in contact with side walls of the short axis pair of first active regions 110A and 110B. The first insulating layer 232 continuously extends along the second shortest distance L2 between the long axis pair of first active regions 110A and 110C while being in contact with side walls of the long axis pair of first active regions 110A and 110C.

FIGS. 2A and 2B show an exemplary first isolation region 230 only including the first insulating layer 232. However, the inventive concept is not limited thereto, and the first isolation region 230 may further include another component different from the first insulating layer 232. According to an embodiment, the first isolation region 230 may include void regions formed in and/or near the first insulating layer 232.

In the second region II of the substrate 102, a plurality of second active regions 120 are defined by a second isolation region 240.

The second isolation region 240 includes a trench insulating layer 242 that covers side walls 120S of the plurality of second active regions 120, an insulating liner 244 that covers the trench insulating layer 242, and a gap-fill insulating layer 246 that is formed on the insulating liner 244.

A thickness T3 of the trench insulating layer 242 of the second region II is equal to or greater than ½ of the second shortest distance L2 of the first region I (0.5*L1≤T3). A thickness T4 of the insulating liner 244 of the second region II may be greater than the thickness T3 of the trench insulating layer 242 (T3<T4).

The first insulating layer 232 of the first region I is formed of the same material as the trench insulating layer 242 of the second region II. The first insulating layer 232 in the first region I is formed of a different material from the insulating liner 244 in the second region II.

In some embodiments, the first insulating layer 232, the trench insulating layer 242, and the gap-fill insulating layer 246 are oxide layers, and the insulating liner 244 is a nitride layer.

Figure 3A:
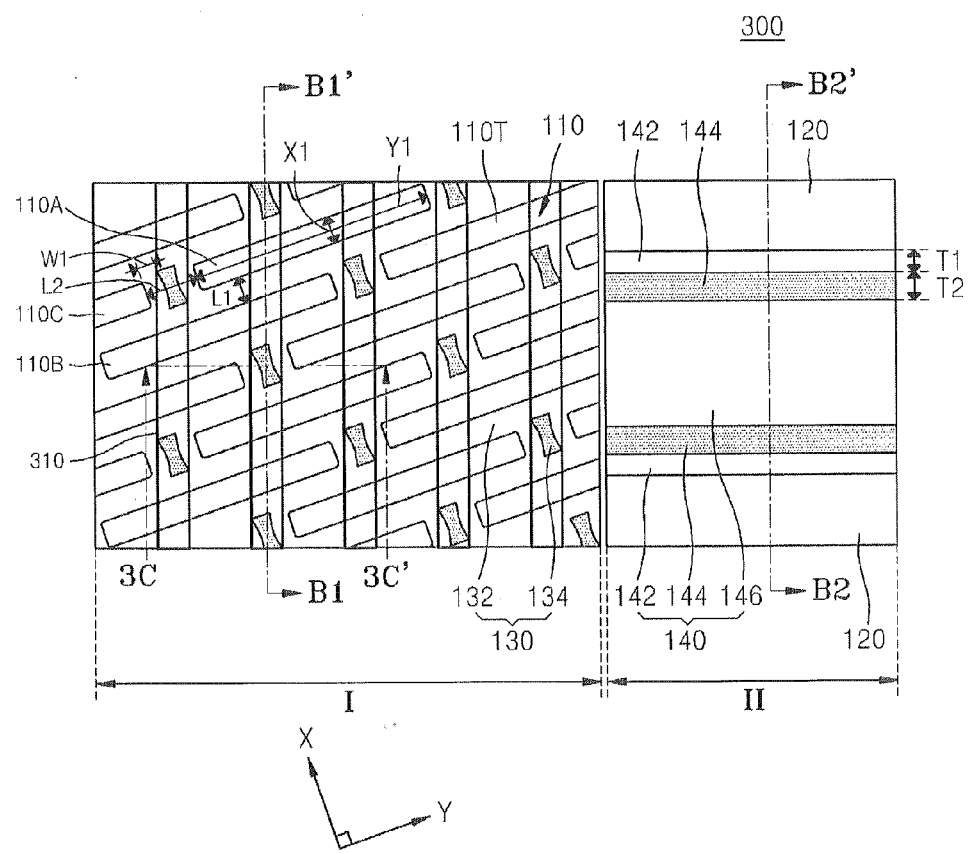
FIG. 3A is a plan layout of a semiconductor device according to an embodiment of the inventive concept.
Figure 3B:
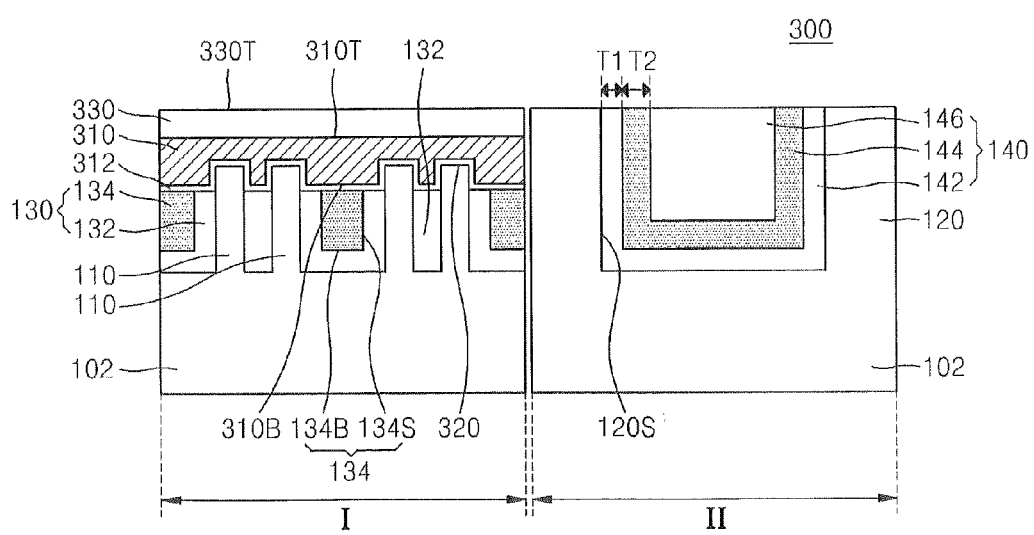
FIG. 3B shows a cross-sectional view taken along lines B1-B1' and B2-B2' of FIG. 3A.
Figure 3C:
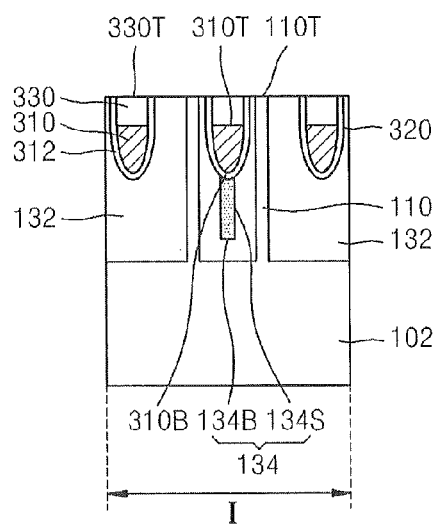
FIG. 3C shows a cross-sectional view taken along line 3C-3C' of FIG. 3A.

FIG. 3A is a plan layout of a semiconductor device 300 according to an embodiment of the inventive concept. FIG. 3B shows a cross-sectional view taken along lines B1-B1' and B2-B2' of FIG. 3A. FIG. 3C shows a cross-sectional view taken along line 3C-3C' of FIG. 3A.

Referring to FIGS. 3A to 3C, the semiconductor device 300 includes a plurality of buried word lines 310 that extend to cross the second shortest distance L2 between the long axis pair of first active regions 110A and 110C. The plurality of buried word lines 310 are formed in a plurality of trenches 320 that cross the plurality of first active regions 110 and the first isolation region 130. Inner walls of the plurality of trenches 320 are covered with a plurality of gate dielectric films 312. The plurality of gate dielectric films 312 are interposed between the plurality of buried word lines 310 and the plurality of first active regions 110. An upper surface 310T of the plurality of buried word lines 310 is disposed at a lower level than the upper surface 110T of the plurality of first active regions 110. In the trenches 320, a plurality of buried insulating layers 330 are formed to cover the plurality of buried word lines 310. The upper surface 330T of the plurality of buried insulating layers 330 is disposed at the same level as the upper surface 110T of the plurality of first active regions 110.

The first insulating layer 132 of the first isolation region 130 and the plurality of first active regions 110 respectively face the plurality of word lines 310 with the plurality of gate dielectric films 312 disposed therebetween. The plurality of second insulating layers 134 contained in the first isolation region 130 face the lower surface 310B of the plurality of buried word lines 310 with the gate dielectric films 312 disposed therebetween.

As shown in FIG. 3B, among the bottoms of the plurality of trenches 320, a bottom through which the substrate 102 is exposed is at a higher level than a bottom through which the isolation region 130 is exposed. Accordingly, the lower surface of the buried word lines 310 has protrusions and recesses corresponding to the bottom profile of the plurality of trenches 320, a saddle-fin transistor (saddle FINFET) is formed in the plurality of first active regions 110.

The plurality of buried word lines 310 include at least one material selected from the group consisting of Ti, TiN, Ta, TaN, W, WN, TiSiN, and WSiN. The plurality of gate dielectric films 312 may be oxide layers formed by using atomic layer deposition (ALD). The plurality of gate dielectric films 312 include at least one material selected from a silicon oxide, $HfO_2$, $Al_2O_3$, $HfAlO_3$, $Ta_2O_3$, $TiO_2$, and oxide/nitride/oxide (ONO).

In the semiconductor device 300 shown in FIGS. 3A to 3C, side walls of the plurality of first active regions 110 of the first region I are covered with the first insulating layer 132 having a relatively great thickness, and side walls of the plurality of second active regions 120 of the second region II are covered with the trench insulating layer 142 having a relatively great thickness. As appreciated by the present inventors, in a PMOS transistor, a hot electron induced punch-through (HEIP) phenomenon (caused by electrons injected into the isolation region) may be inhibited, so increased power consumption, decreased operational speed, and punch-through may be reduced, and cell refresh may be improved. In addition, even if the semiconductor device 300 has an ultra-fine pitch size, the reliability of transistors may not deteriorate in response to a change of the design rule and reliability may be maintained.

Figure 4A:
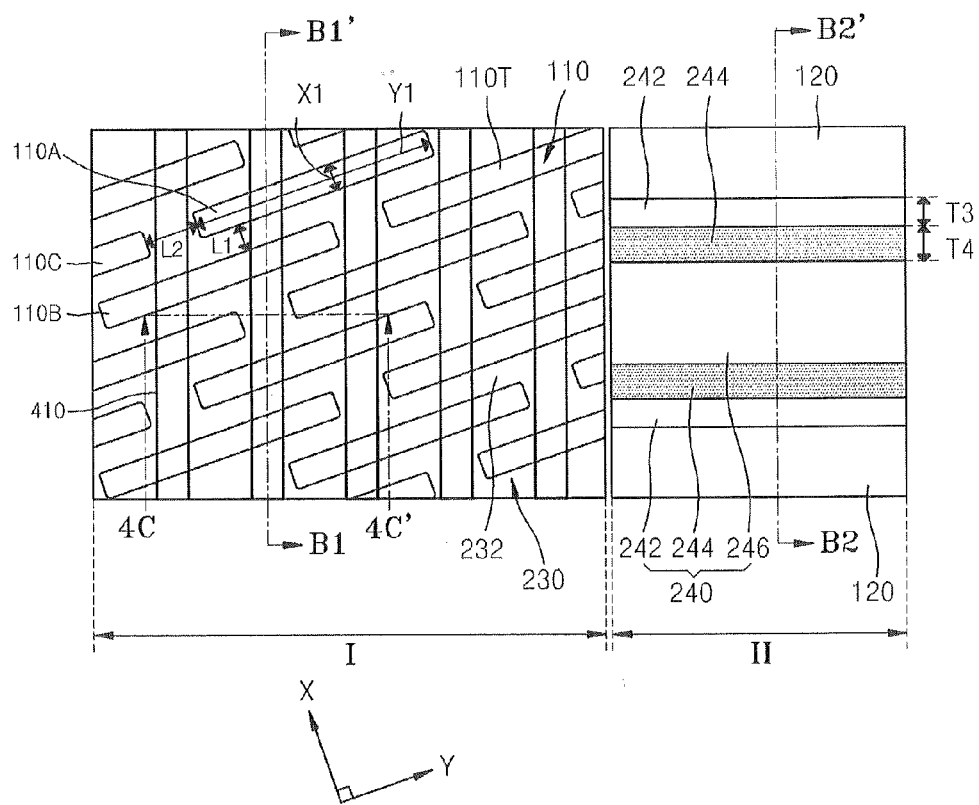
FIG. 4A is a plan layout of a semiconductor device according to an embodiment of the inventive concept.
Figure 4B:
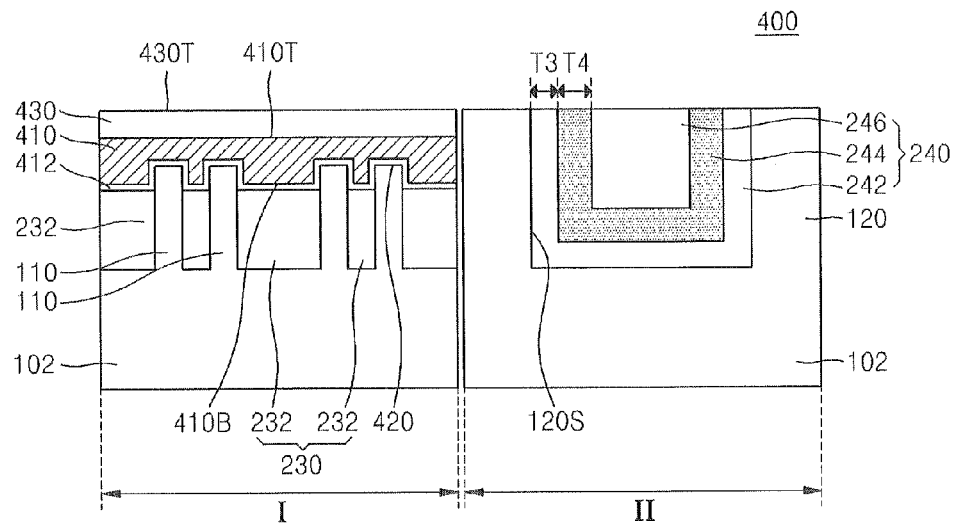
FIG. 4B shows a cross-sectional view taken along lines B1-B1' and B2-B2' of FIG. 4A.
Figure 4C:
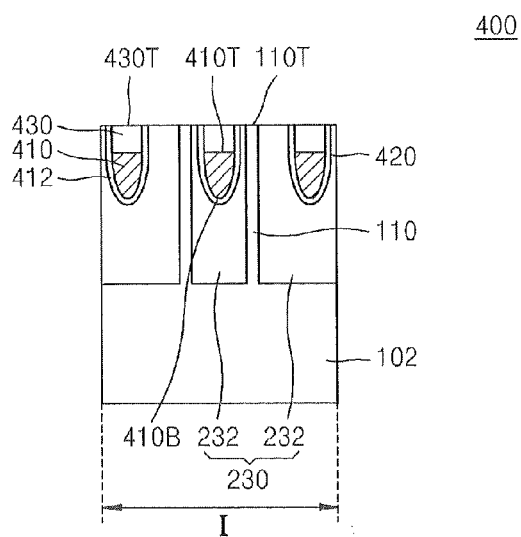
FIG. 4C shows a cross-sectional view taken along line 4C-4C' of FIG. 4A.

FIG. 4A is a plan layout of a semiconductor device 400 according to an embodiment of the inventive concept. FIG. 4B shows a cross-sectional view taken along lines B1-B1' and B2-B2' of FIG. 4A. FIG. 4C shows a cross-sectional view taken along line 4C-4C' of FIG. 4A. The same reference numerals in FIGS. 4A to 4C as those in FIGS. 1A to 2B denote the same elements, and thus, their description is omitted.

Referring to FIGS. 4A to 4C, the semiconductor device 400 includes a plurality of buried word lines 410 that extend to cross the second shortest distance L2 between the long axis pair of active regions 110A and 110C. The plurality of buried word lines 410 are formed in a plurality of trenches 420 that cross the plurality of first active regions 110 and the first isolation region 230. Inner walls of the plurality of trenches 420 are covered with a plurality of gate dielectric films 412. The plurality of gate dielectric films 412 are interposed between the plurality of buried word lines 410 and the plurality of first active regions 110. The upper surface 410T of the plurality of buried word lines 410 is disposed at a lower level than the upper surface 110T of the plurality of first active regions 110. In the plurality of trenches 420, a plurality of buried insulating layers 430 are formed to cover the plurality of buried word lines 410. The upper surface 430T of the plurality of buried insulating layers 430 is disposed at the same level as the upper surface 110T of the plurality of first active regions 110.

The first insulating layer 232 of the first isolation region 230 and the plurality of first active regions 110 respectively face the plurality of word lines 410 with the plurality of gate dielectric films 412 disposed therebetween.

As shown in FIG. 4B, among the bottoms of the plurality of trenches 420, a bottom through which the substrate 102 is exposed is at a higher level than a bottom through which the first isolation region 230 is exposed. Accordingly, the lower surface of the buried word lines 410 has protrusions and recesses corresponding to the bottom profile of the plurality of trenches 420, a saddle-fin transistor (saddle FINFET) is formed in the plurality of first active regions 110.

The plurality of buried word lines 410 and the plurality of gate dielectric films 412 are the same as the plurality of buried word lines 310 and the plurality of gate dielectric films 312 described above with reference to FIGS. 3A to 3C.

In the semiconductor device 400 shown in FIGS. 4A to 4C, the first isolation region 230 defining the plurality of first active regions 110 in the first region I is formed only of the first insulating layer 232, and side walls of the plurality of second active regions 120 in the second region II are covered with the trench insulating layer 242 which is relatively thick. Thus, in a PMOS transistor, an HEIP phenomenon (into the isolation region) may be inhibited, so that increased power consumption, decreased operational speed, and punch-through may be reduced, and cell refresh may be improved. In addition, even when the semiconductor device 400 has an ultra-fine pitch size, the reliability of transistors does not deteriorate in response to a change of a design rule and a desirable reliability may be maintained.

Figure 5A:
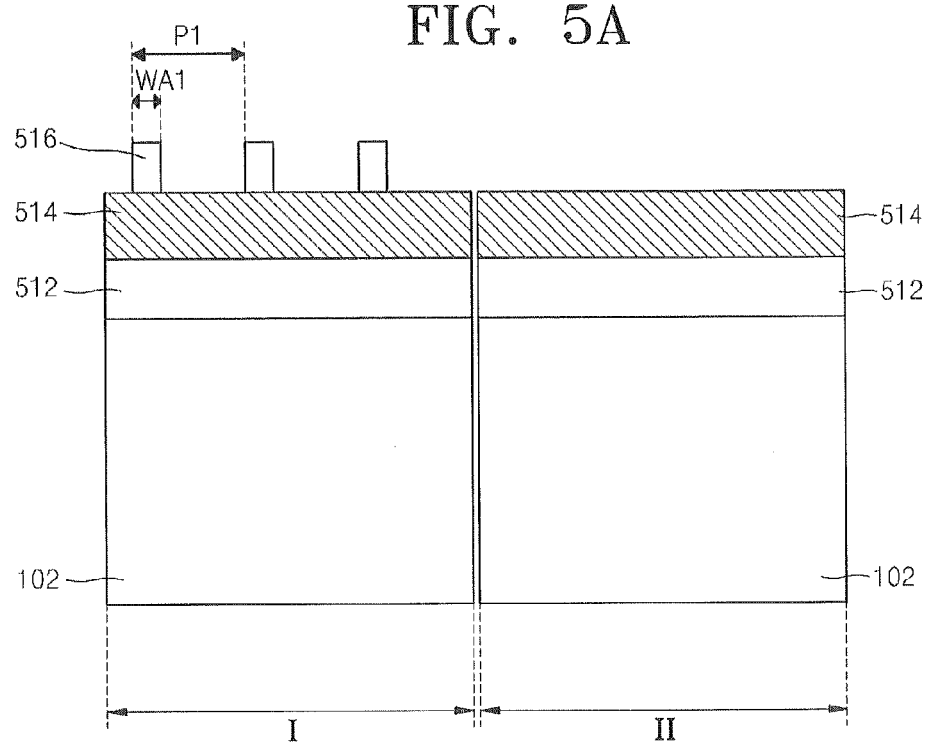
FIGS. 5A to 5P are cross-sectional views of a semiconductor device in a processing order for describing a method of manufacturing a semiconductor device according to an embodiment of the inventive concept.
Figure 5B:
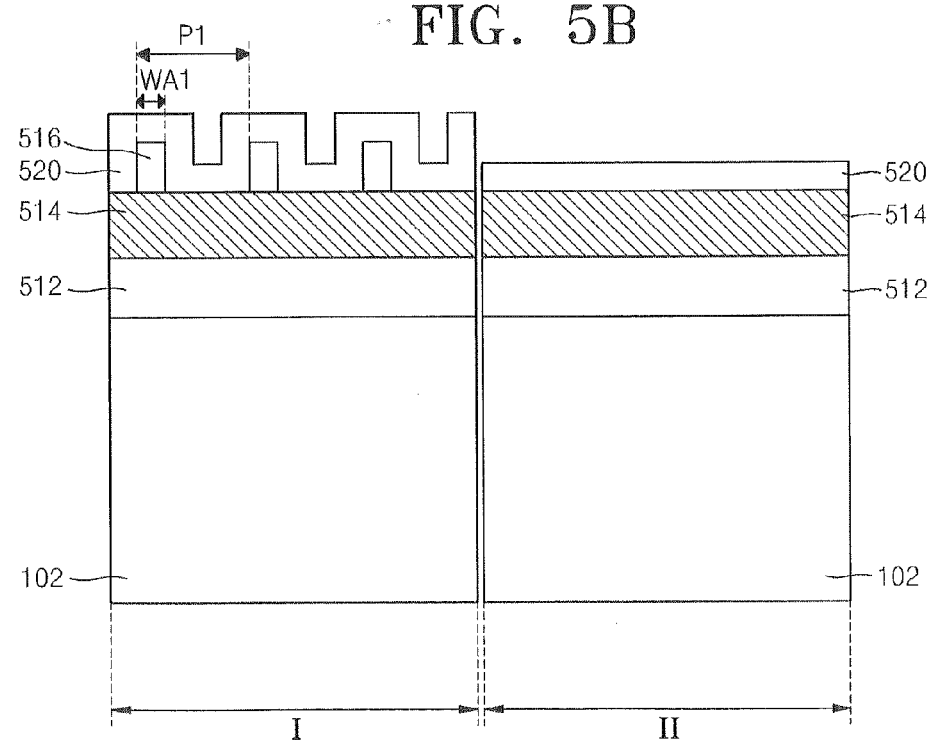
Figure 5C:
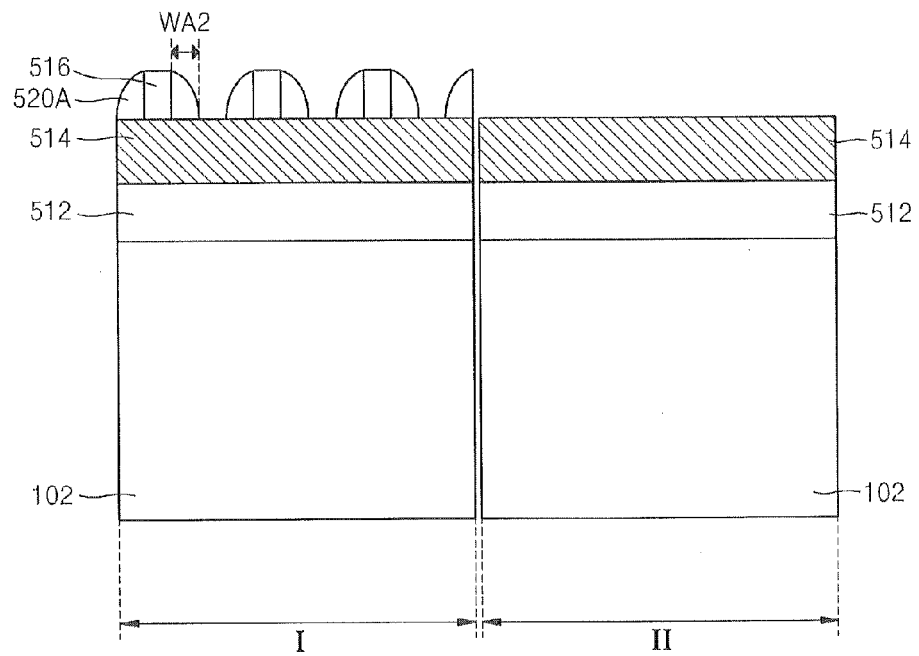
Figure 5D:
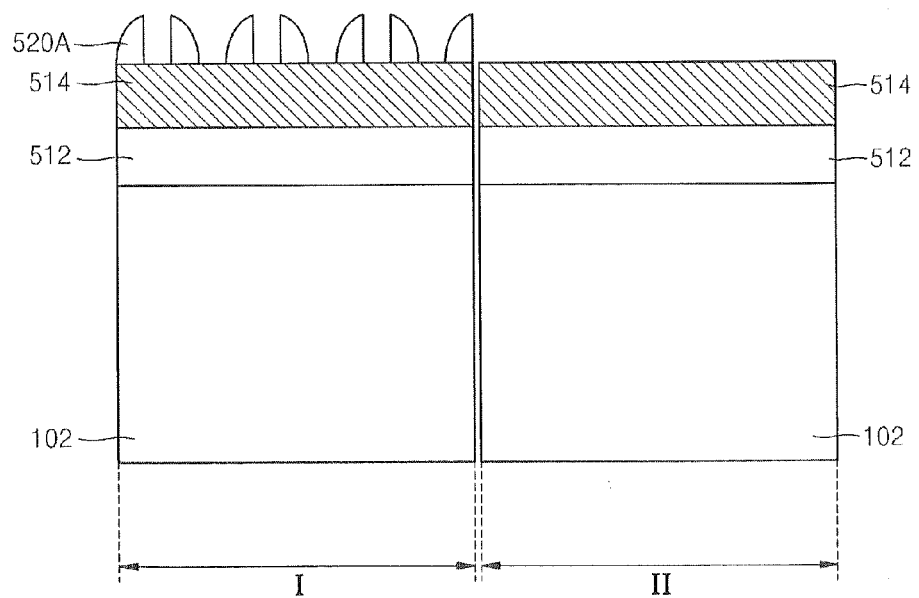
Figure 5E:
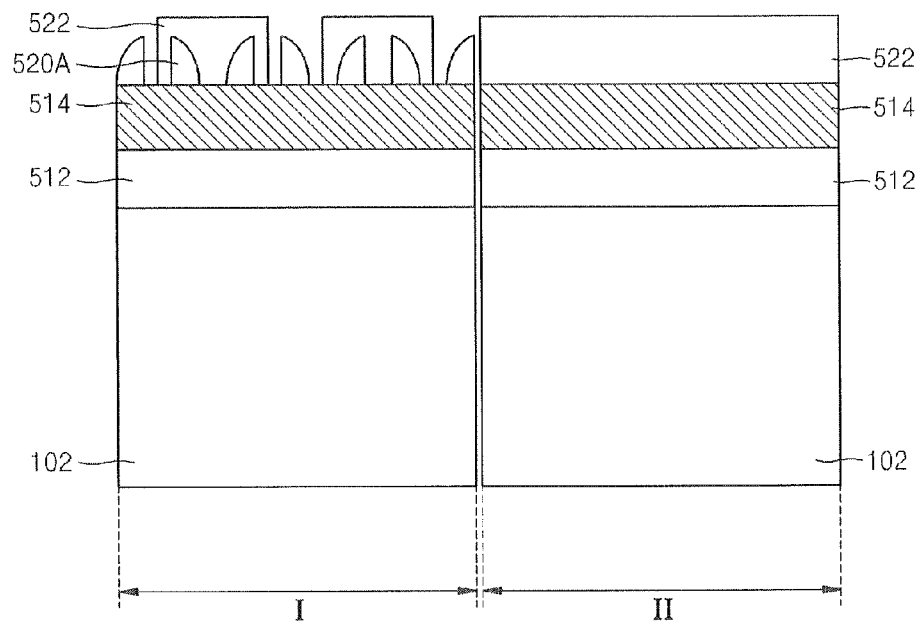
Figure 5F:
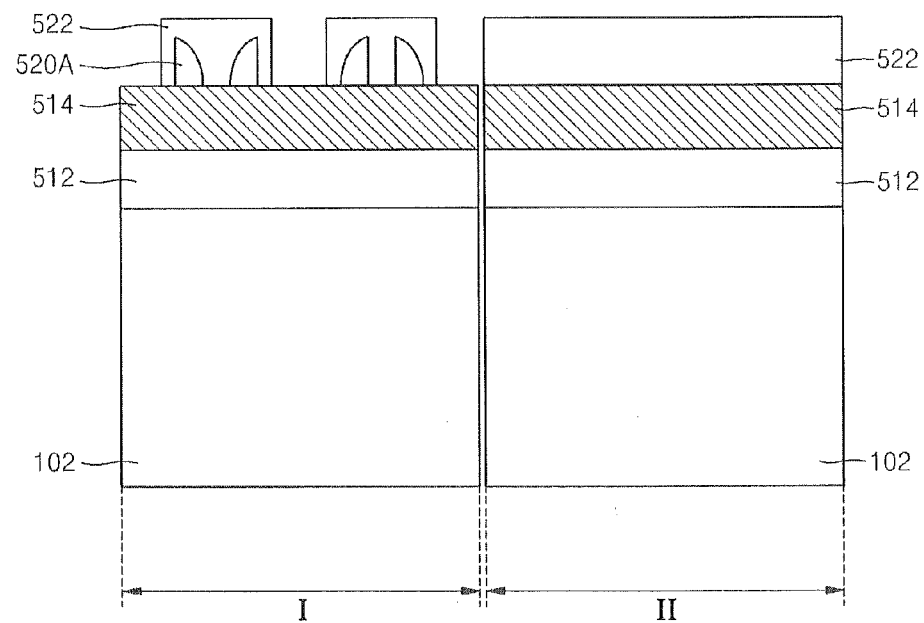
Figure 5G:
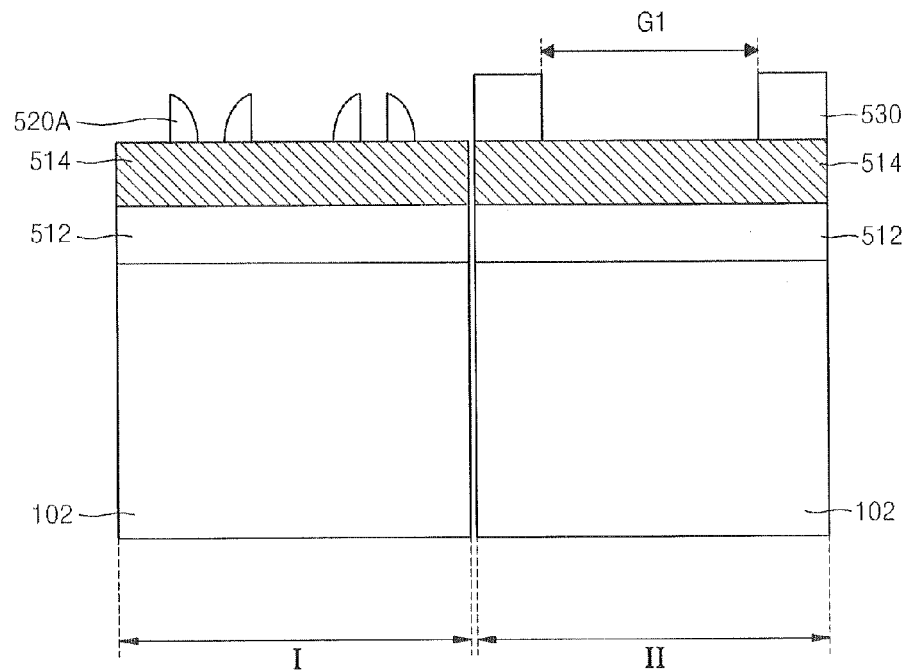
Figure 5H:
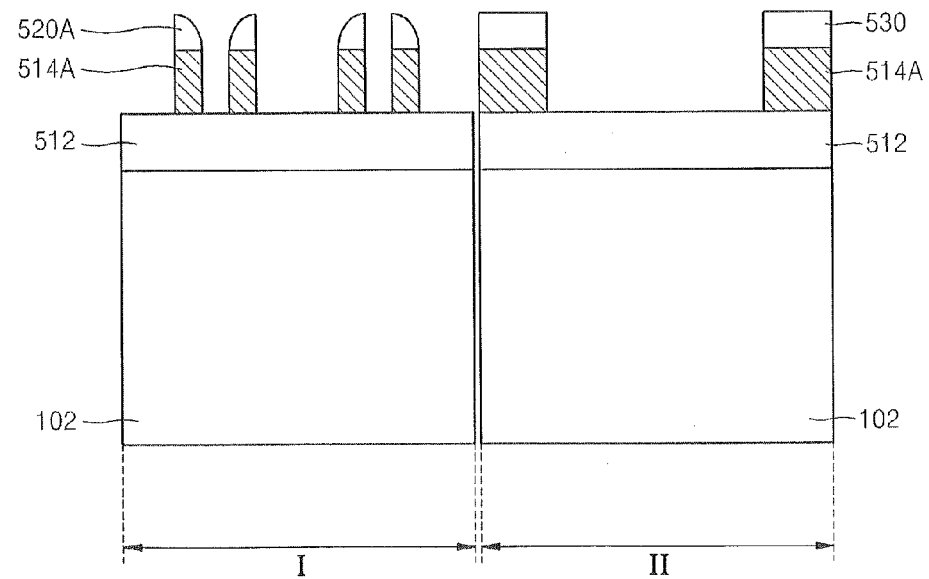
Figure 5I:
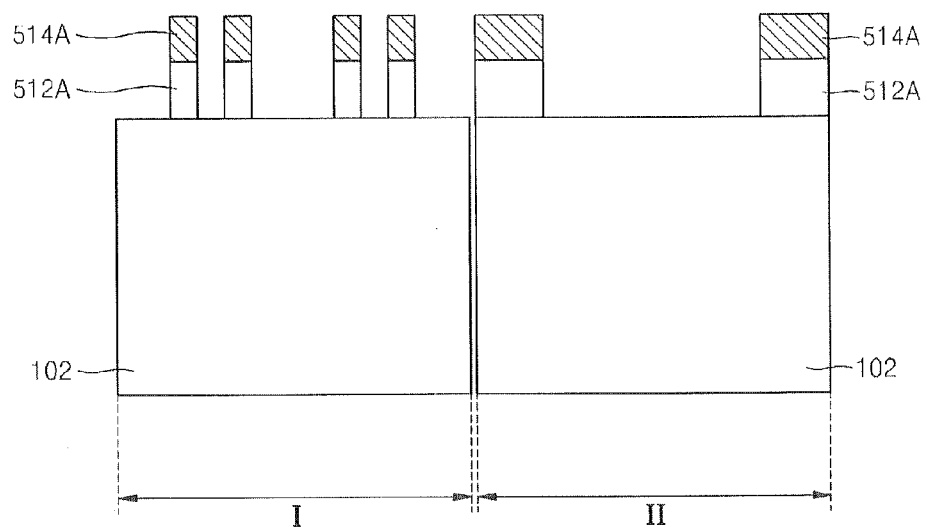
Figure 5J:
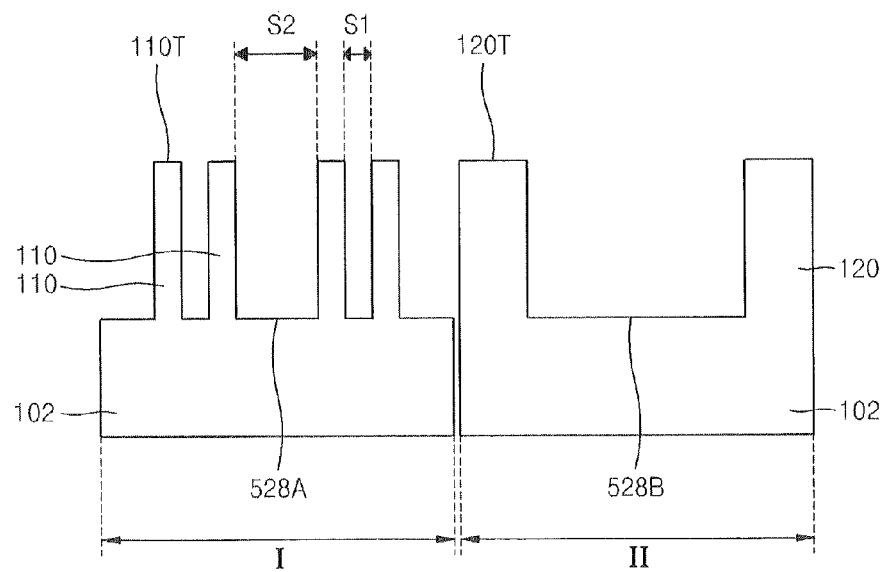
Figure 5K:
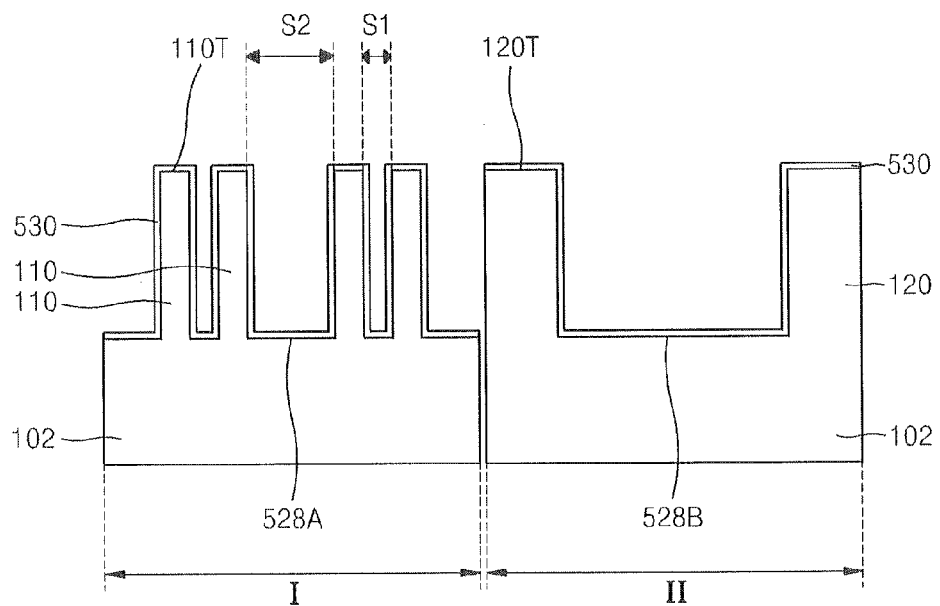
Figure 5L:
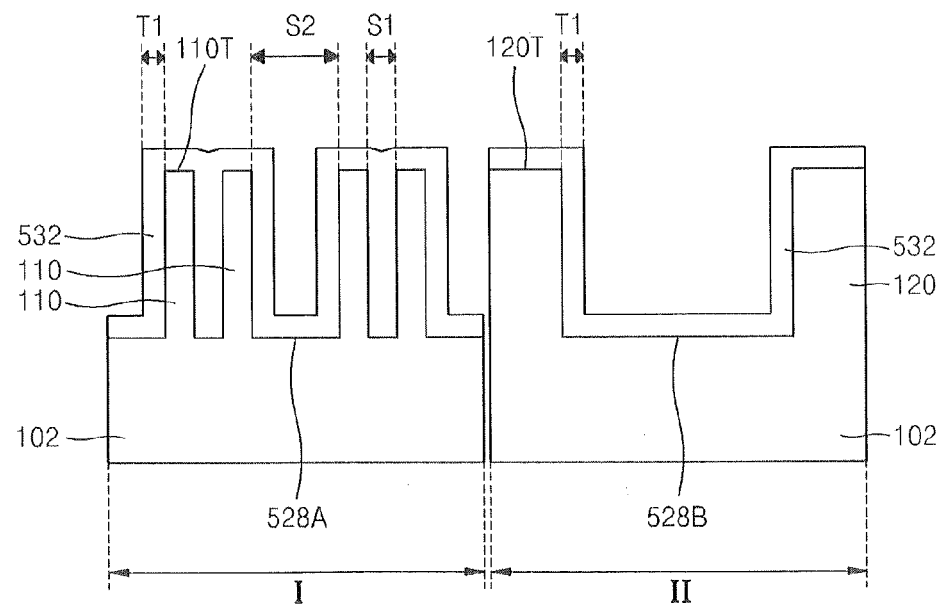
Figure 5M:
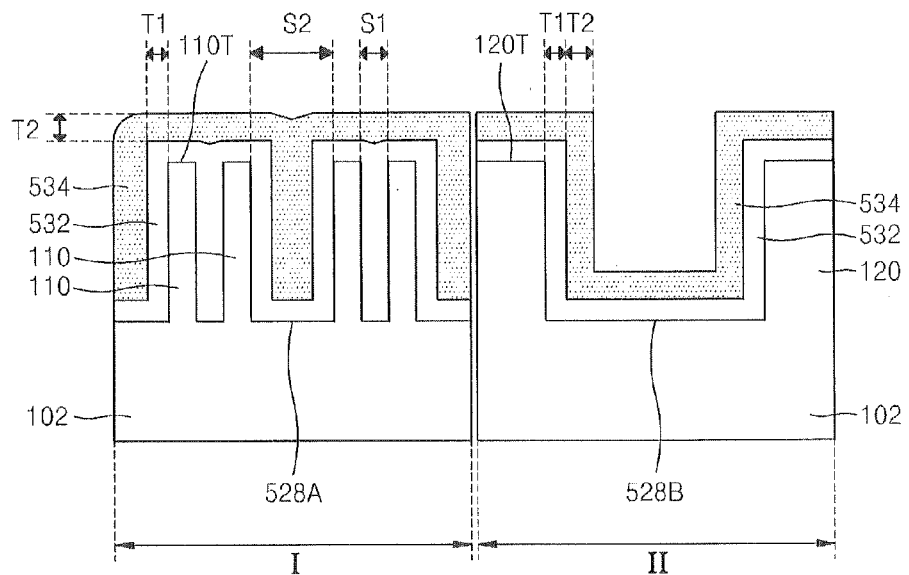
Figure 5N:
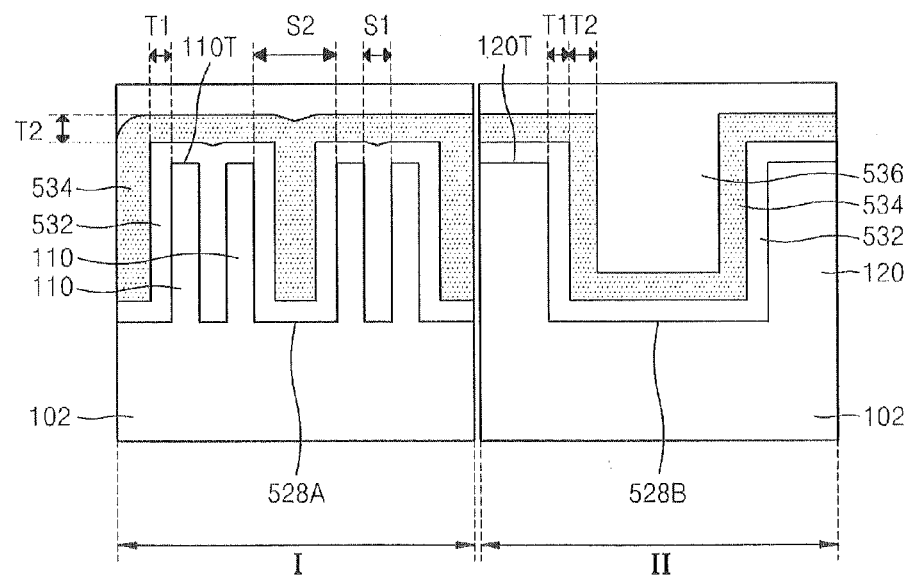
Figure 5O:
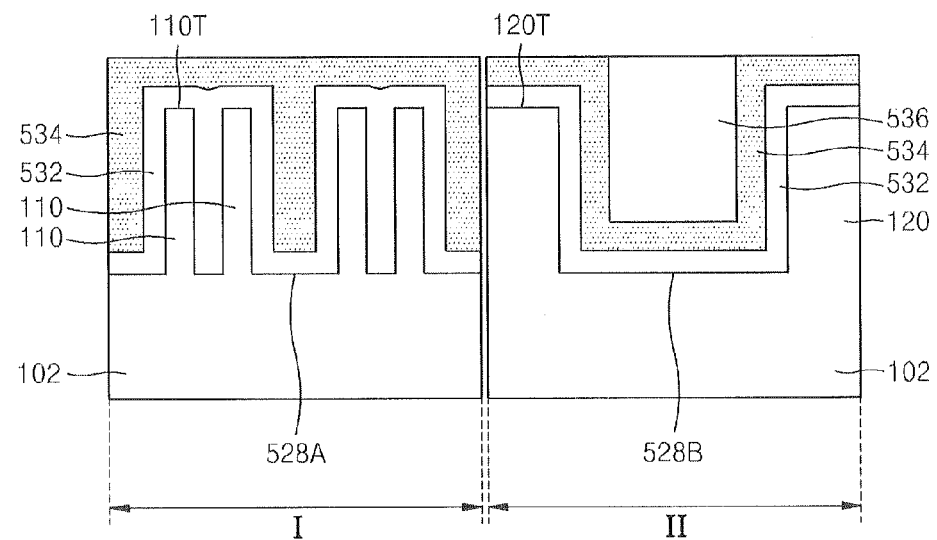
Figure 5P:
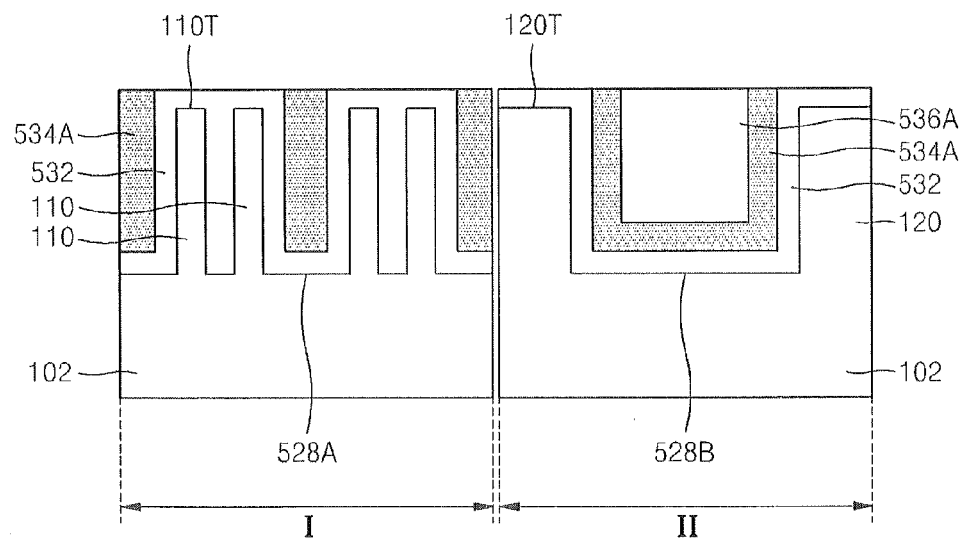

FIGS. 5A to 5P are cross-sectional views of a semiconductor device illustrating sequential operations of a process of manufacturing a semiconductor device according to an embodiment of the inventive concept. FIGS. 5A to 5P show cross-sectional views corresponding to cross-sectional views taken along lines B1-B1' and B2-B2' of FIG. 1A. The same reference numerals in FIGS. 5A to 5P as those in FIGS. 1A to 4C denote the same elements.

Referring to FIG. 5A, a first hard mask layer 512 and a second hard mask layer 514 are sequentially formed on the substrate 102 in the first region I and the second region II. Then, a plurality of mold mask patterns 516 are formed on the second hard mask layer 514 in the first region I.

The first hard mask layer 512 and the second hard mask layer 514 are respectively formed of materials having different etch-selectivity from each other. In addition, the second hard mask layer 514 and the plurality of mold mask patterns 516 are respectively formed of materials having different etch-selectivity from each other.

The first hard mask layer 512 may be a silicon oxide layer. The second hard mask layer 514 may be formed of polysilicon. The first hard mask layer 512 and the second hard mask layer 514 may be formed by using chemical vapor deposition (CVD).

The plurality of mold mask patterns 516 may be formed of a carbon-containing layer (SOH layer), an oxide layer, or a nitride layer. The SOH layer may include an organic compound formed of a hydrocarbon compound or derivatives thereof including an aromatic ring such as phenyl, benzene, or naphthalene. The SOH layer may include an organic compound having a relatively high carbon content in the range of about 85 to 99% by weight based on the total weight of the SOH layer and may be formed by using spin coating. In order to form the plurality of mold mask patterns 516, an etching process using a photoresist pattern (not shown) formed by a photolithography process that is commonly used in the art as an etch mask is used.

In the first region I, the plurality of mold mask patterns 516 have a first width WA1 and are repeatedly formed at a first pitch P1. In some embodiments, the first width WA1 is ¼ of the first pitch P1. The plurality of mold mask patterns 516 are formed as a plurality of lines repeatedly formed on the substrate 102 in a predetermined direction at the first pitch P1.

Referring to FIG. 5B, a mask layer 520 that covers the upper surface and side walls of the plurality of mold mask patterns 516 is formed on the structure including the plurality of mold mask patterns 516.

The mask layer 520 covers the upper surface and both side walls of the plurality of mold mask patterns 516 with a uniform thickness.

If the second hard mask layer 514 is formed of polysilicon and the plurality of mold mask patterns 516 are formed of an SOH layer, the mask layer 520 may be an oxide layer.

Referring to FIG. 5C, an etchback process is performed on the mask layer 520 (FIG. 5B) in the first region I and the second region II, so that a plurality of spacers 520A that cover the side walls of each of the plurality of mold masks pattern 516 are formed in the first region I, and the upper surface of the second hard mask layer 514 is exposed in the second region II. The plurality of spacers 520A have a loop-shaped planar structure.

The plurality of spacers 520A have a second width WA2. The second width WA2 may be the same as the first width WA1 of the plurality of mold mask patterns 516.

Referring to FIG. 5D, the plurality of mold mask patterns 516 are removed in the first region I, so that the upper surface of the second hard mask layer 514 is exposed within each of the loops formed of the plurality of spacers 520A.

Referring to FIG. 5E, a trimming mask pattern 522 that exposes a portion of the plurality of spacers 520A is formed on the plurality of spacers 520A in the first region I and the second region II.

After the trimming mask pattern 522 is formed, a portion of each of the plurality of spacers 520A is exposed near the trimming mask pattern 522 in the first region I. On the substrate 102, portions of the plurality of spacers 520A covered with the trimming mask pattern 522 correspond to regions in which the plurality of first active regions 110 (FIGS. 1A and 1B) are formed.

The trimming mask pattern 522 includes a developable bottom anti-reflective coating (DBARC) film that covers the plurality of spacers 520A and the second hard mask layer 514, and a photoresist pattern that covers the DBARC film.

Referring to FIG. 5F, a trimming process is performed so that exposed ones of the plurality of spacers 520A are etched in the first region I by using the trimming mask pattern 522 as an etch mask.

As a result of the trimming process, the exposed ones of the plurality of spacers 520A are removed in the first region I, and remaining ones of the plurality of spacers 520A remain in a region that vertically overlaps with a region in which the plurality of first active regions 110 (FIGS. 1A and 1B) will be formed in the substrate 102.

Referring to FIG. 5G, the trimming mask pattern 522 (FIG. 5E) is removed in the first region I and the second region II, and then, a plurality of wide mask patterns 530 are formed on the second hard mask layer 514 in the second region II.

The plurality of wide mask patterns 530 are spaced apart from each other by a relatively large gap G1 via which the upper surface of the second hard mask layer 514 is exposed. The gap G1 corresponds to a width of an isolation trench which will be formed in the second region II of the substrate 102.

The plurality of wide mask patterns 530 are formed by using photolithography. For example, the plurality of wide mask patterns 530 may have a stack structure including an SOH layer with a planarized upper surface and an SiON layer covering the SOH layer. Alternatively, the plurality of wide mask patterns 530 may include a DBARC film and a photoresist pattern covering the DBARC film.

Referring to FIG. 5H, a plurality of second hard mask patterns 514A are formed in the first region I and the second region II by etching the second hard mask layer 514 in the first region I, using the plurality of spacers 520A as an etch mask in the first region I and using the wide mask patterns 530 as an etch mask in the second region II.

The plurality of spacers 520A and the plurality of wide mask patterns 530 may remain on the upper surface of the plurality of second hard mask patterns 514A.

Referring to FIG. 5I, a plurality of first hard mask patterns 512A are formed by etching the first hard mask layer 512, using the plurality of second hard mask patterns 514A as an etch mask in the first region I and the second region II.

The plurality of second hard mask patterns 514A may remain on the upper surfaces of the plurality of first hard mask patterns 512A.

Referring to FIG. 5J, the exposed portion of the substrate 102 is etched using the plurality of first hard mask patterns 512A as an etch mask in the first region I and the second region II to form a first isolation trench 528A that defines the plurality of first active regions 110 in the first region I of the substrate 102 and to form a second isolation trench 528B that defines the plurality of second active regions 120 in the second region II.

After forming the first and second isolation trenches 528A and 528B, the upper surface 110T of the plurality of first active regions 110 and the upper surface 120T of the plurality of second active regions 120 are respectively exposed by removing the first hard mask pattern 512A that remained on the substrate 102.

The first isolation trench 528A has a first space S1 having a relatively small width and a second space S2 having a greater width.

Referring to FIG. 5K, a polysilicon thin film 530 is formed on the exposed surface of the substrate 102 in the first region I and the second region II.

The polysilicon thin film 530 is formed to improve switching characteristics of a cell transistor by reducing consumption of the plurality of first active regions 110 by oxidation during a following oxidation process and securing a desired area of the plurality of first active regions 110. The polysilicon thin film 530 covers inner walls of the first and second isolation trenches 528A and 528B, the upper surface 110T of the plurality of first active regions 110, and the upper surface 120T of the plurality of second active regions 120 with a uniform thickness. For example, the polysilicon thin film 530 may have a thickness in the range of about 10 Å to about 30 Å.

The process of forming the polysilicon thin film 530 described above with reference to 5K may not be performed.

Referring to FIG. 5L, a first insulating layer 532 is formed on the substrate 102 in the first region I and the second region II.

The thickness T1 of the first insulating layer 532, as shown in the first region I of FIG. 1A, is equal to or greater than ½ of the first shortest distance L1 between the short axis pair of first active regions 110A and 110B (0.5*L1≤T1). Thus, the first space S1 of the first isolation trench 528A in the first region I is filled with the first insulating layer 532. However, the second space S2 of the first isolation trench 528A in the first region I is not completely filled with the first insulating layer 532. In addition, the second isolation trench 528B is not completely filled with the first insulating layer 532 in the second region II, and the first insulating layer 532 conformally covers the inner walls of the second isolation trench 528B. In the first space S1 of the first isolation trench 528A, a seam may be formed in the first insulating layer 532 as a result of a deposition process. In addition, in the first space S1 of the first isolation trench 528A, a void (not shown) generated by the seam may be formed in the first insulating layer 532.

The first insulating layer 532 may be a silicon oxide layer. The first insulating layer 532 may be formed by using at least one process selected from an ALD process, a chemical vapor deposition (CVD) process, a radical oxidation process, and a natural oxidation process.

While the first insulating layer 532 is formed, at least a portion of the polysilicon thin film 530 is oxidized, and the oxidized product may constitute a portion of the first insulating layer 532. As shown in FIG. 5L, the polysilicon thin film 530 is entirely oxidized and the oxidized resultant forms a portion of the first insulating layer 532, so that the polysilicon thin film 530 does not remain between the substrate 102 and the first insulating layer 532.

If the polysilicon thin film 530 described with reference to FIG. 5K is not formed, the first insulating layer 532 may be formed by using an ALD process.

After forming the first insulating layer 532, the second space S2 of the first isolation trench 528A is partially exposed in the second shortest distance L2 between the long axis pair of active regions 110A and 110C, as shown in the first region I of FIG. 1A.

Referring to FIG. 5M, a second insulating layer 534 is formed on the first insulating layer 532 in the first region I and the second region II.

The thickness T2 of the second insulating layer 534 is greater than the thickness T1 of the first insulating layer 532 (T1<T2). In addition, the thickness T2 of the second insulating layer 534 is equal to or greater than ½ of a portion of the second space S2 remaining in the first insulating layer 532. Thus, the second insulating layer 534 is not formed in the first space S1 filled with the first insulating layer 532 in the first isolation trench 528A of the first region I, and the second space S2 remaining in the first insulating layer 532 is filled with the second insulating layer 534. On the other hand, the second insulating layer 534 is formed to conformally cover the first insulating layer 532 in the second isolation trench 528B of the second region II, and upper space of the second isolation trench 528B remains vacant.

The second insulating layer 534 may be a nitride layer. For example, the second insulating layer 534 may be a silicon nitride layer. The second insulating layer 534 may be formed by using an ALD process or a CVD process.

In the second space S2 of the first isolation trench 528A, a seam may be formed in the second insulating layer 534 as a result of a deposition process. In addition, in the second space S2 of the first isolation trench 528A, a void may be generated by the seam in the second insulating layer 534.

Referring to FIG. 5N, a third insulating layer 536 is formed on the second insulating layer 534 in the first region I and the second region II.

The third insulating layer 536 has a thickness sufficient to fill the remaining space of the second isolation trench 528B in the second region II.

The third insulating layer 536 may be an oxide layer. For example, the third insulating layer 536 is formed of any one material selected from Tonen SilaZene (TOSZ), high density plasma (HDP) oxide, flowable oxide (FOX), spin on glass (SOG), undoped silica glass (USG), tetraethyl orthosilicate (TEOS), and low temperature oxide (LTO).

Referring to FIG. 5O, the third insulating layer 536 is planarized by using the second insulating layer 534 as an etch-stop layer. In order to planarize the third insulating layer 536, a chemical mechanical polishing (CMP) process may be used.

As a result, the third insulating layer 536 may be completely removed in the first region I, but the third insulating layer 536 filling the first isolation trench 528B remains in the second region II. The upper surface of the second insulating layer 534 may be partially removed during the planarizing process of the third insulating layer 536.

Referring to FIG. 5P, the third insulating layer 536 exposed in the second region II is removed from the upper surface thereof by a predetermined thickness to form a third insulating layer pattern 536A, the second insulating layer 534 exposed in the first region I and the second region II is removed from the upper surface thereof by a predetermined thickness to form the second insulating layer pattern 534A, and the upper surface of the first insulating layer 532 is exposed in the first region I and the second region II.

The third insulating layer 536 may be removed from the upper surface thereof by a predetermined thickness through a strip process using phosphoric acid ($H_3PO_4$). In addition, a strip process using hydrogen fluoride (HF) may be used in order to remove the second insulating layer 534 from the upper surface thereof by a predetermined thickness.

The upper surface 110T of the plurality of first active regions 110 in the first region I and the upper surface 120T of the plurality of second active region 120 in the second region II are covered with the first insulating layer 532. The first insulating layer 532 remaining in the first region I and second region II may function as a sacrificial layer for protecting the surface of the substrate 102 during a subsequent ion injection process to inject impurity ions into the substrate 102 or during a subsequent etching process. Thus, a separate process of forming the sacrificial layer may not be needed during the ion injection process or during the etching process.

A plurality of ion injection regions, such as a plurality of source/drain regions and a channel ion implantation region, may be formed in the plurality of first active regions 110 of the first region I and the plurality of second active regions 120 of the second region II by performing at least one ion implantation process by which impurity ions are implanted into the substrate 102 when the first insulating layer 532 covers the upper surface of the substrate 102 in the first region I and the second region II.

The first insulating layer 132 and the second insulating layer 134 shown in FIGS. 1A and 1B may be obtained from portions of the first insulating layer 532 and the second insulating layer pattern 534A in the first region I, respectively, after performing subsequent processes. In addition, the trench insulating layer 142, the insulating liner 144, and the gap-fill insulating layer 146 shown in FIGS. 1A and 1B may be obtained from portions of the first insulating layer 532, the second insulating layer pattern 534A, and the third insulating layer pattern 536A in the second region II, respectively.

FIGS. 6A to 6E are cross-sectional views of a semiconductor device in a processing order for describing a method of manufacturing a semiconductor device according to an embodiment of the inventive concept. FIGS. 6A to 6E show cross-sectional views corresponding to cross-sectional views taken along lines B1-B1' and B2-B2' of FIG. 2A. The same reference numerals in FIGS. 6A to 6E as those in FIGS. 1A to 5P denote the same elements.

Figure 6A:
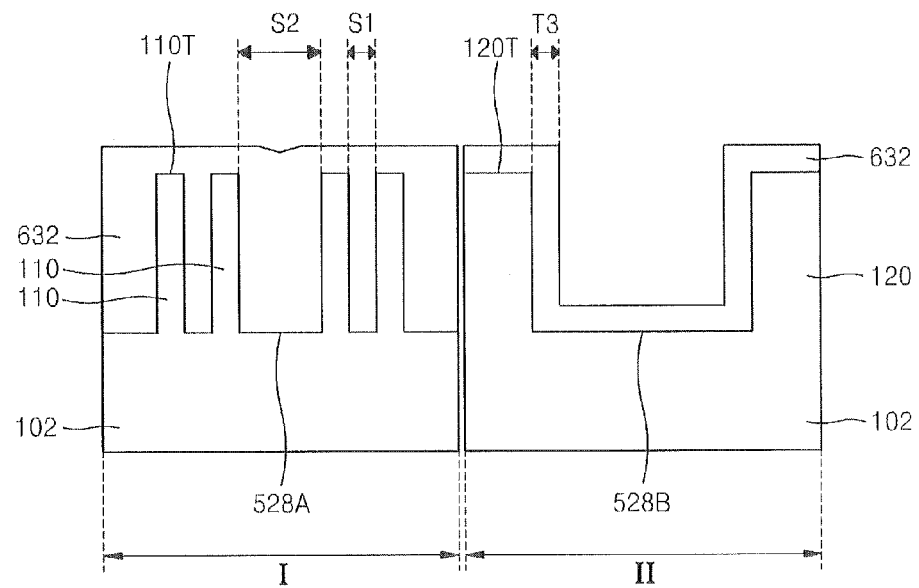
FIGS. 6A to 6E are cross-sectional views of a semiconductor device in a processing order for describing a method of manufacturing a semiconductor device according to an embodiment of the inventive concept.

Referring to FIG. 6A, a first insulating layer 632 is formed on the substrate 102 in the first region I and the second region II, after performing processes described above with reference to FIGS. 5A to 5K, in a similar manner to the preparation of the first insulating layer 532 described above with reference to FIG. 5L after performing the processes described above with reference to FIGS. 5A to 5K. The thickness T3 of the first insulating layer 632, as shown in the first region I of FIG. 2A, is equal to or greater than ½ of the second shortest distance L2 between the long axis pair of first active regions 110A and 110C ($0.5*L2 \leq T3$). Thus, the first space S1 and the second space S2 of the first isolation trench 528A in the first region I is filled with the first insulating layer 632. On the other hand, in the second isolation trench 528B of the second region II, the first insulating layer 632 conformally covers inner walls of the second isolation trench 528B. In the first space S1 and the second space S2 of the first isolation trench 528A, a seam may be formed in the first insulating layer 632 as a result of a deposition process. In the first space S1 and the second space S2 of the first isolation trench 528A, a void may be generated by the seam formed in the first insulating layer 632.

The first insulating layer 632 may be a silicon oxide layer. The first insulating layer 632 may be formed by using at least one process selected from an ALD, a CVD process, a radical oxidation process, and a natural oxidation process.

While the first insulating layer 632 is formed, the polysilicon thin film 530 may be formed as described above with reference to FIG. 5K, and at least a portion of the polysilicon thin film 530 that covers the surface of the substrate 102 may be oxidized, and the oxidized product may constitute a portion of the first insulating layer 632. As shown in FIG. 6A, while the first insulating layer 632 is formed, the polysilicon thin film 530 may be entirely oxidized and the oxidized resultant may form a portion of the first insulating layer 632, so that the polysilicon thin film 530 does not remain between the substrate 102 and the first insulating layer 632.

Figure 6B:
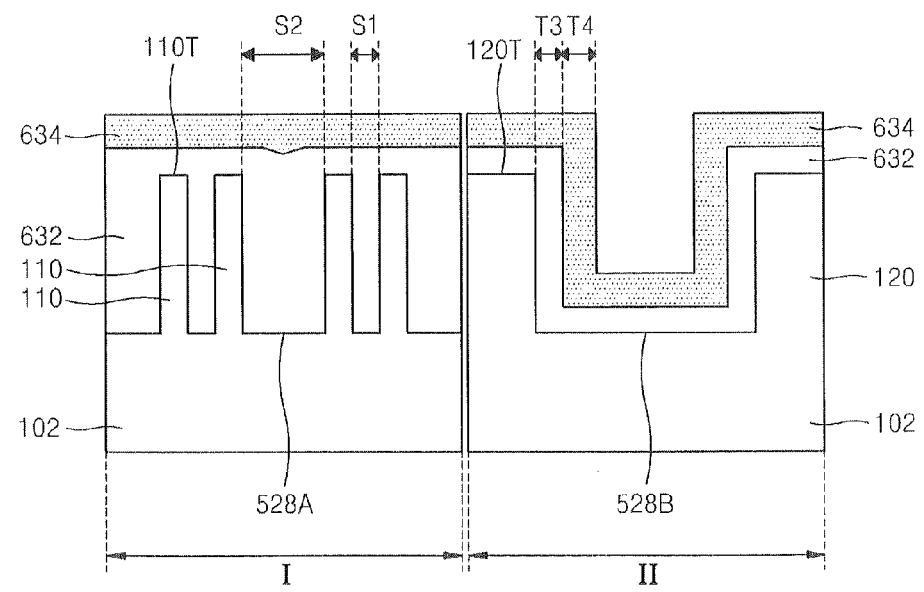

Referring to FIG. 6B, a second insulating layer 634 is formed on the first insulating layer 632 in the first region I and the second region II in a similar manner to the preparation of the second insulating layer 534 described above with reference to FIG. 5M.

The thickness T4 of the second insulating layer 634 is greater than the thickness T3 of the first insulating layer 632 ($T3<T4$). The second insulating layer 634 is formed on the first insulating layer 632 at a higher level than the upper surface of the substrate 102 in the first region I. In the second isolation trench 528B of the second region II, the second insulating layer 634 is formed to conformally cover the first insulating layer 632, and upper space of the second isolation trench 528B remains vacant.

The second insulating layer 634 may be a nitride layer. For example, the second insulating layer 634 may be a silicon nitride layer. The second insulating layer 634 may be formed by using an ALD process or a CVD process.

Figure 6C:
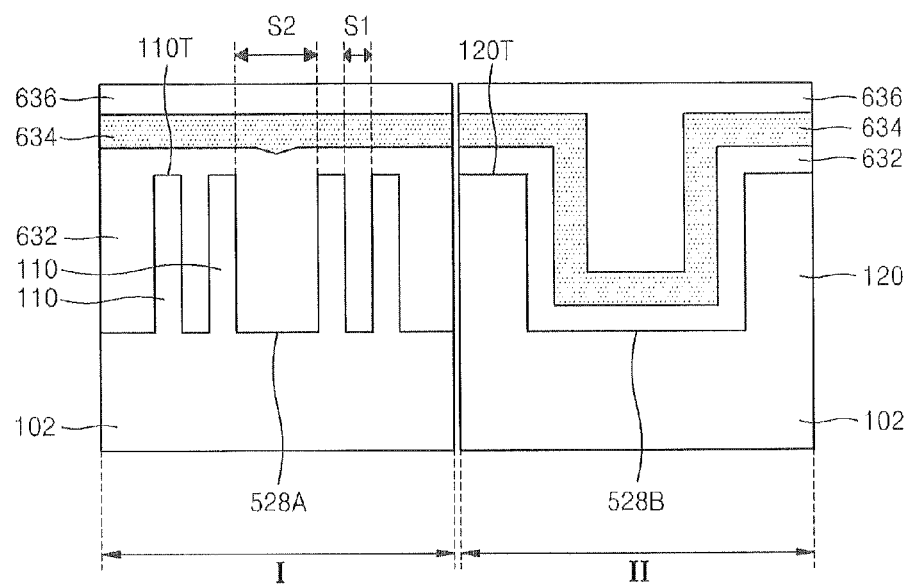

Referring to FIG. 6C, a third insulating layer 636 is formed on the second insulating layer 634 in the first region I and the second region II in a similar manner to the preparation of the third insulating layer 536 described above with reference to FIG. 5N.

The third insulating layer 636 has a thickness sufficient to fill the remaining space of the second isolation trench 528B in the second region II.

The third insulating layer 636 is the same as the third insulating layer 536 described above with reference to FIG. 5N.

Figure 6D:
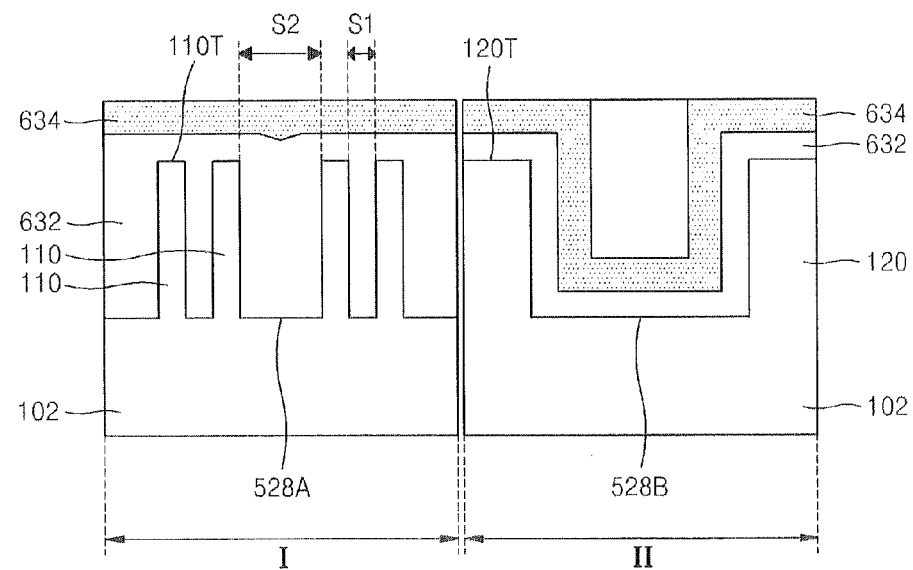

Referring to FIG. 6D, the third insulating layer 636 is planarized by using the second insulating layer 634 as an etch-stop layer in a similar manner to that described above with reference to FIG. 5O. In order to planarize the third insulating layer 636, a CMP process may be used.

As a result, the third insulating layer 636 may be removed in the first region I, but remains in the second region II.

Figure 6E:
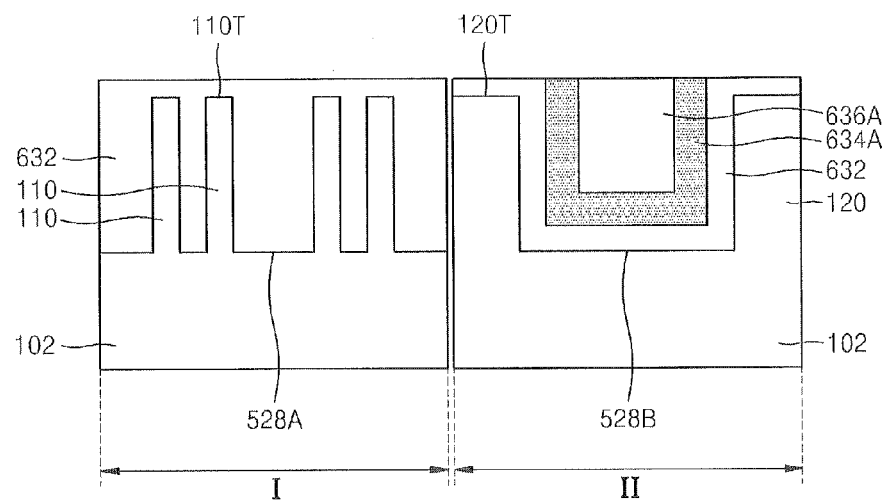

Referring to FIG. 6E, the third insulating layer 636 exposed in the second region II is removed from the upper surface thereof by a predetermined thickness to form the third insulating layer pattern 636A, the second insulating layer 634 exposed in the first region I and the second region II is removed from the upper surface thereof by a predetermined thickness to form the second insulating layer pattern 634A, and the upper surface of the first insulating layer 632 is exposed in the first region I and the second region II, in a similar manner to that described above with reference to FIG. 5P.

The third insulating layer 636 may be removed from the upper surface thereof by a predetermined thickness using a strip process using phosphoric acid ($H_3PO_4$). In addition, a strip process using hydrogen fluoride (HF) may be used in order to remove the second insulating layer 634 from the upper surface thereof by a predetermined thickness.

The upper surface 110T of the plurality of first active regions 110 in the first region I and the upper surface 120T of the plurality of second active regions 120 in the second region II are covered with the first insulating layer 632. The first insulating layer 632 remaining in the first region I and second region II may function as a sacrificial layer for protecting the surface of the substrate 102 during a subsequent ion implantation process to implant impurity ions into the substrate 102 or during a subsequent etching process. Thus, a process of forming the sacrificial layer may not be conducted during the ion implantation process or during the etching process.

A plurality of ion implantation regions, such as a plurality of source/drain regions (not shown) and a channel ion implantation region, may be formed in the plurality of first active regions 110 of the first region I and the plurality of second active regions 120 of the second region II by performing at least one ion implantation process by which impurity ions are implanted into the substrate 102 when the first insulating layer 632 covers the upper surface of the substrate 102 in the first region I and the second region II.

The first insulating layer 232 shown in FIGS. 2A and 2B may be obtained from a portion of the first insulating layer 632 in the first region I after subsequent processes. In addition, the trench insulating layer 242, the insulating liner 244, and the gap-fill insulating layer 246 shown in FIGS. 2A and 2B may be obtained from portions of the first insulating layer 632, the second insulating layer pattern 634A, and the third insulating layer pattern 636A in the second region II, respectively.

Figure 7A:
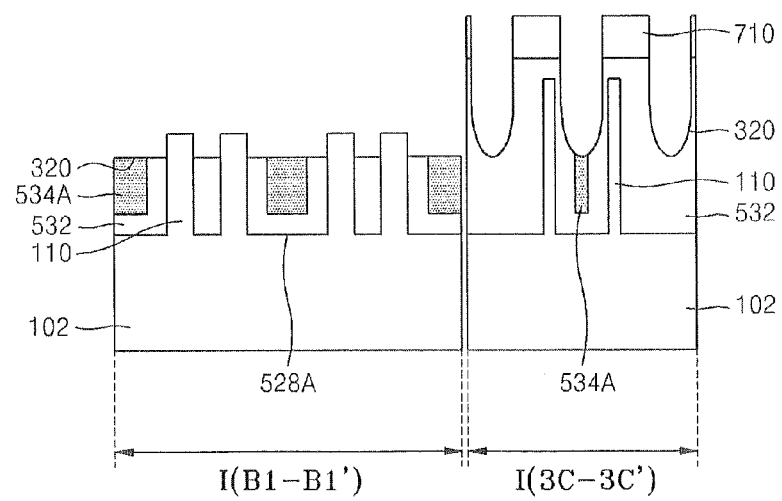
FIGS. 7A to 7C are cross-sectional views of a semiconductor device in a processing order for describing a method of manufacturing a semiconductor device according to an embodiment of the inventive concept.
Figure 7B:
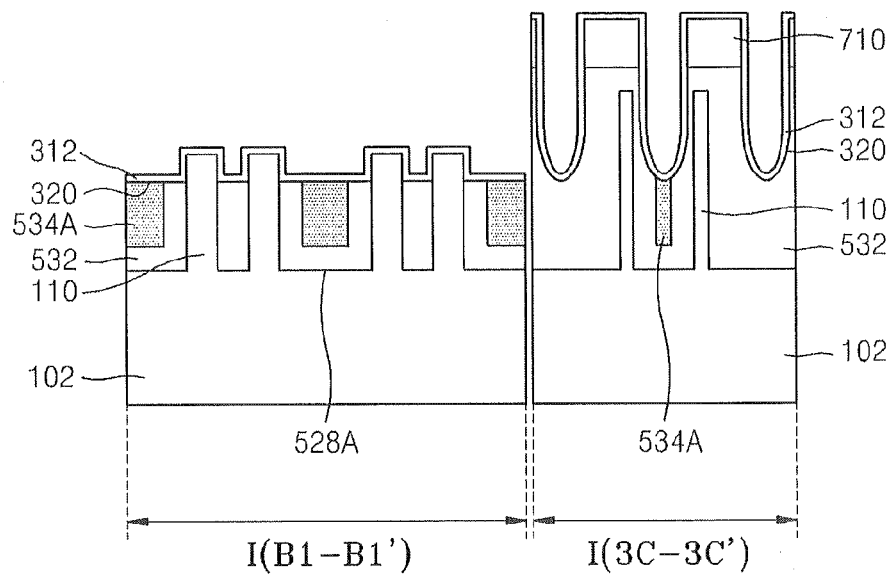
Figure 7C:
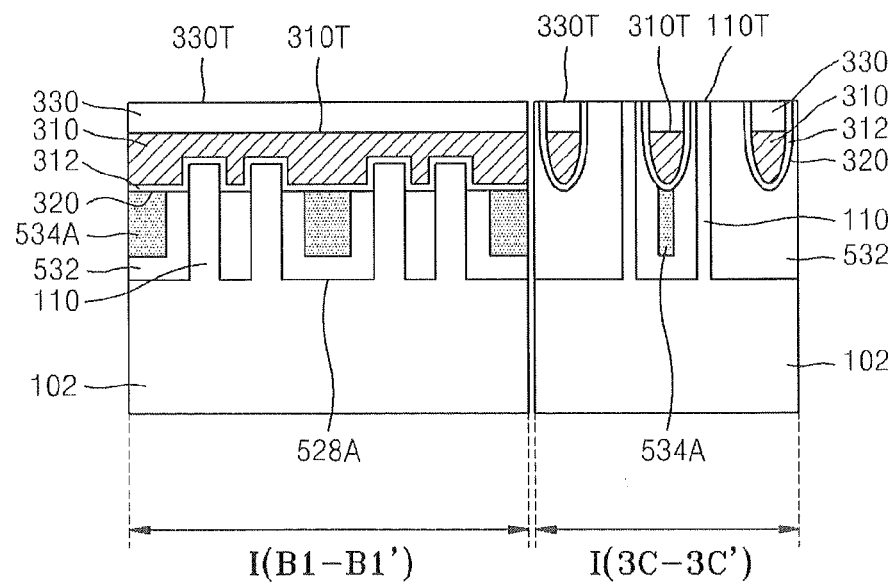

FIGS. 7A to 7C are cross-sectional views of a semiconductor device in a processing order for describing a method of manufacturing a semiconductor device according to an embodiment of the inventive concept. FIGS. 7A to 7C show cross-sectional views corresponding to cross-sectional views taken along lines B1-B1' and 3C-3C' of FIG. 3A.

The same reference numerals in FIGS. 7A to 7C as those in FIGS. 1A to 5P denote the same elements.

Referring to FIG. 7A, a plurality of mask patterns 710 are formed on the first insulating layer 532 and the second insulating layer pattern 534A when the first insulating layer 532 covers the upper surface of the substrate 102 in the first region I and the second region II after performing the processes described above with reference to FIGS. 5A to 5P. The plurality of mask patterns 710 may have a plurality of lines and space patterns.

In the first region I, the first insulating layer 532 and the second insulating layer pattern 534A are partially exposed through the plurality of mask patterns 710. The second region II is covered with the plurality of mask patterns 710.

Then, the first insulating layer 532, the second insulating layer pattern 534A, and the substrate 102 are respectively etched to desired depths using the plurality of mask patterns 710 as an etch mask in the first region I to form a plurality of trenches 320 that extend to cross the plurality of first active regions 110, the first insulating layer 532, and the second insulating layer pattern 534A.

As shown in FIGS. 3B and 7A, in order to form the plurality of trenches 320 having bottoms with steps, the first insulating layer 532, the second insulating layer pattern 534A, and the substrate 102 are respectively etched using separate etching processes, so that an etch depth of the first insulating layer 532 and the second insulating layer pattern 534A, and an etch depth of the substrate 102 are different from each other.

Referring to FIG. 7B, the structure including the plurality of trenches 320 undergoes a cleaning process, and then a plurality of gate dielectric films 312 are formed on the inner walls of the plurality of trenches 320.

The plurality of gate dielectric films 312 may have a thickness in the range of about 20 Å to about 70 Å. Detailed descriptions of the gate dielectric films 312 are the same as those described above with reference to FIGS. 3A to 3B.

If the first insulating layer 532 has a void, the void may be exposed on the inner walls of the plurality of trenches 320. In this regard, if the plurality of gate dielectric films 312 are formed by using an ALD process, the void exposed on the inner walls of the plurality of trenches 320 is blocked by the plurality of gate dielectric films 312. Thus, a short circuit between adjacent conductive layers caused when a conductive material forming word lines infiltrates into the first insulating layer 532 via the void may be prevented when the word lines are formed in the plurality of trenches 320.

Referring to FIG. 7C, the plurality of buried word lines 310 that partially fill the plurality of trenches 320 are formed on the plurality of gate dielectric films 312, and then the plurality of buried insulating layers 330 are formed in the remaining portion of the plurality of trenches 320. Then, a planarizing process is conducted to remove unnecessary materials on the substrate 102 until the upper surface 110T of the plurality of first active regions 110 is exposed. The planarizing may be performed by using a CMP process.

The plurality of buried word lines 310 and the plurality of buried insulating layers 330 are described above with reference to FIGS. 3A to 3C.

Figure 8A:
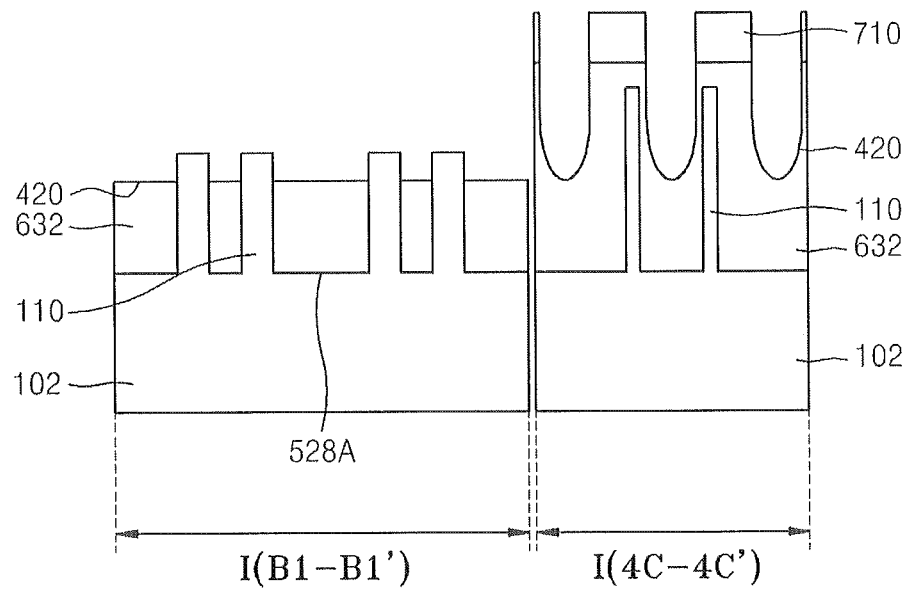
FIGS. 8A to 8C are cross-sectional views of a semiconductor device in a processing order for describing a method of manufacturing a semiconductor device according to an embodiment of the inventive concept.
Figure 8B:
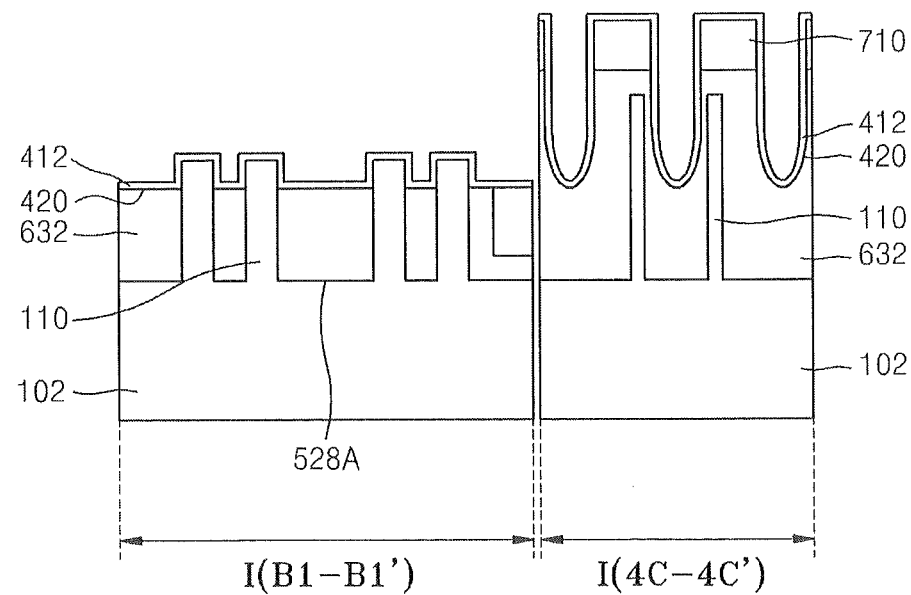
Figure 8C:
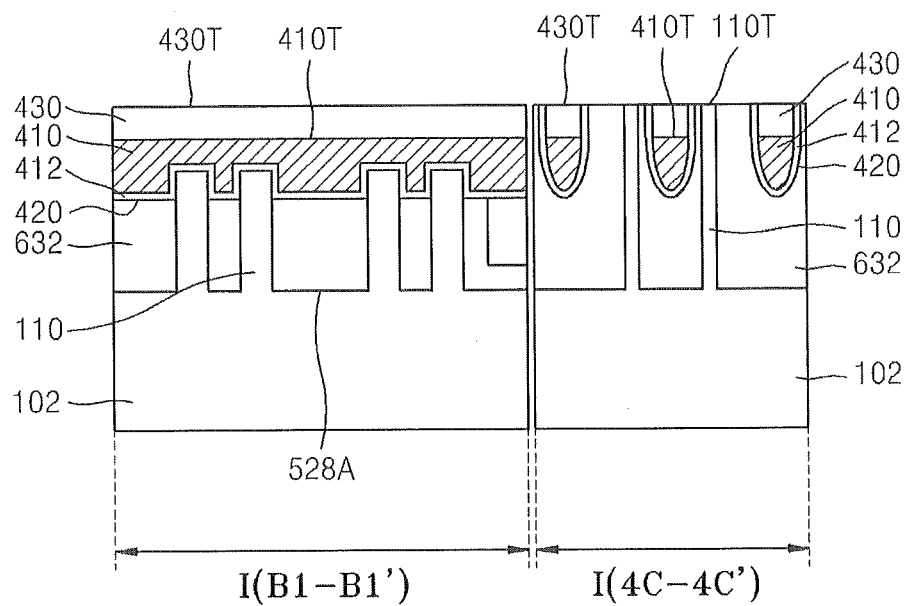

FIGS. 8A to 8C are cross-sectional views of a semiconductor device in a processing order for describing a method of manufacturing a semiconductor device according to an embodiment of the inventive concept. FIGS. 8A to 8C show cross-sectional views corresponding to cross-sectional views taken along lines B1-B1' and 4C-4C' of FIG. 4A. The same reference numerals in FIGS. 8A to 8C as those in FIGS. 1A to 7C denote the same elements, and thus, their description is omitted.

Referring to FIG. 8A, the plurality of mask patterns 710 are formed on the first insulating layer 632 when the first insulating layer 632 covers the upper surface of the substrate 102 in the first region I and the second region II after performing the processes described above with reference to FIGS. 6A to 6E.

In the first region I, the first insulating layer 632 is partially exposed through the plurality of mask patterns 710. The second region II is covered with the plurality of mask patterns 710.

Then, the first insulating layer 632 and the substrate 102 are respectively etched to desired depths using the plurality of mask patterns 710 as an etch mask to form the plurality of trenches 420 that extend to cross the plurality of first active regions 110 and the first insulating layer 632.

As shown in FIGS. 4B and 8A, in order to form the plurality of trenches 420 having bottoms with steps, the first insulating layer 632 and the substrate 102 are respectively etched using separate etching processes, so that an etch depth of the first insulating layer 632 and an etch depth of the substrate 102 are different from each other.

Referring to FIG. 8B, the structure including the plurality of trenches 420 undergoes a cleaning process, and then, a plurality of gate dielectric films 412 are formed on the inner walls of the plurality of trenches 420.

The plurality of gate dielectric films 412 may have a thickness in the range of about 20 Å to about 70 Å. Detailed descriptions of the gate dielectric films 412 are the same as those described above with reference to FIGS. 4A to 4C.

If the first insulating layer 632 has a void, the void may be exposed on the inner walls of the plurality of trenches 420. In this regard, if the plurality of gate dielectric films 412 are formed by using an ALD process, the void exposed on the inner walls of the plurality of trenches 420 is blocked by the plurality of gate dielectric films 412. Thus, a short circuit between adjacent conductive layers caused when a conductive material forming word lines infiltrates into the first insulating layer 632 via the void may be prevented by forming the word lines in the plurality of trenches 420.

Referring to FIG. 8C, a plurality of buried word lines 410 that partially fill the plurality of trenches 420 are formed on the plurality of gate dielectric films 412, and then the plurality of buried insulating layers 430 are formed in the remaining portion of the plurality of trenches 420. Then, a planarizing process is conducted to remove unnecessary materials on the substrate 102 until the upper surface 110T of the plurality of first active regions 110 is exposed. The planarizing may be performed by using a CMP process.

The plurality of buried word lines 410 and the plurality of buried insulating layers 430 are described above with reference to FIGS. 4A to 4C.

Figure 9:
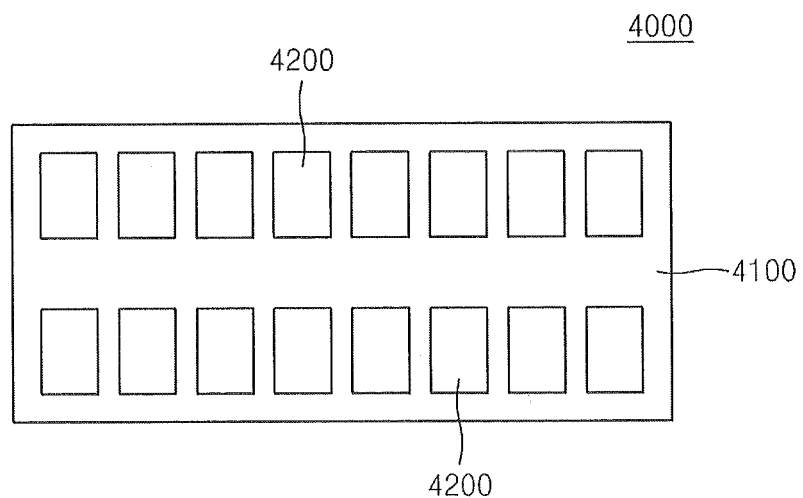
FIG. 9 is a plan view of a memory module including a semiconductor device according to an embodiment of the inventive concept.

FIG. 9 is a plan view of a memory module 4000 including a semiconductor device according to an embodiment of the inventive concept.

The memory module 4000 includes a printed circuit board (PCB) 4100 and a plurality of semiconductor packages 4200.

The plurality of semiconductor packages 4200 may include a semiconductor device according to an embodiment of the inventive concept. Particularly, the plurality of semiconductor packages 4200 may include at least one of the semiconductor devices according to embodiments of the inventive concept described above with reference to FIGS. 1A to 8C.

The memory module 4000 may be a single in-line memory module (SIMM) in which the plurality of semiconductor packages 4200 are aligned on only one side of the PCB 4100, or a dual in-line memory module (DIMM) in which the plurality of semiconductor packages 4200 are aligned on both sides of the PCB 4100.

The memory module 4000 may be a fully buffered DIMM including an advanced memory buffer (AMB) that provides a signal received from an external device to each of the plurality of semiconductor packages 4200.

Figure 10:
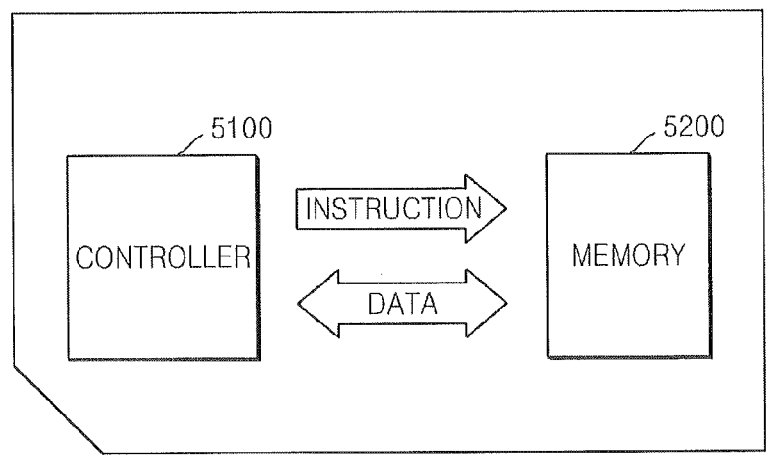
FIG. 10 is a schematic block diagram of a memory card including a semiconductor device according to an embodiment of the inventive concept.

FIG. 10 is a schematic block diagram of a memory card 5000 including a semiconductor device according to an embodiment of the inventive concept.

In the memory card 5000, a controller 5100 and a memory 5200 may be disposed to exchange electrical signals. For example, when the controller 5100 provides an instruction, the memory 5200 may transmit data.

The memory 5200 may include the semiconductor device fabricated according to embodiments of the inventive concept described above with reference to FIGS. 1A to 8C.

The memory card 5000 may be various kinds of memory cards, for example, a memory stick card, a smart media card (SM), a secure digital card (SD), a mini-secure digital card (mini SD), and a multimedia card (MMC).

Figure 11:
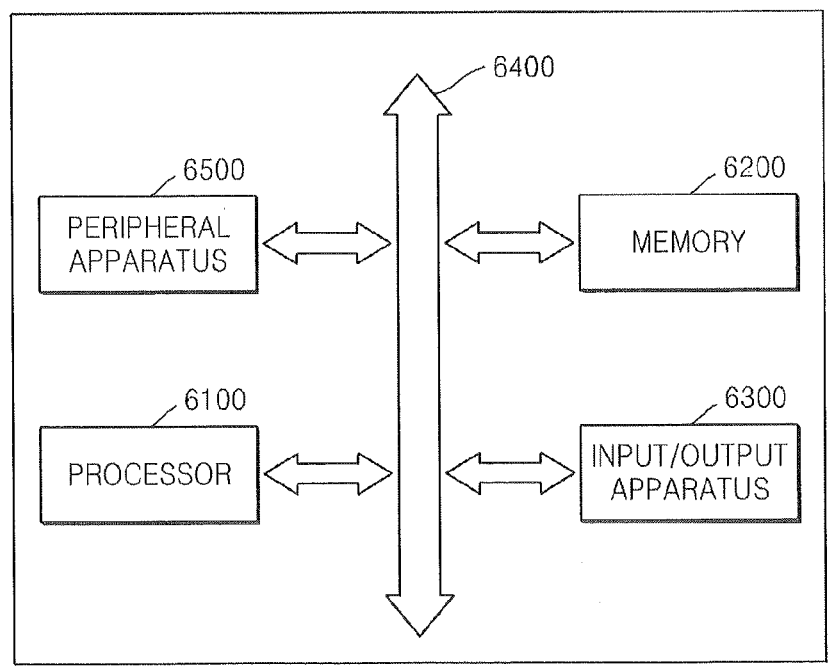
FIG. 11 is a schematic block diagram of a system including a semiconductor device according to an embodiment of the inventive concept.

FIG. 11 is a schematic diagram of a system 6000 including a semiconductor device according to an embodiment of the inventive concept.

In the system 6000, a processor 6100, a memory 6200, and an input/output apparatus 6300 may communicate data with each other via a bus 6400.

The memory 6200 of the system 6000 may include a random access memory (RAM) and a read only memory (ROM). The memory 6200 may store code and data for operating the processor 6100.

In addition, the system 6000 may include a peripheral apparatus 6500 such as a floppy disk drive and a compact disk (CD) ROM drive.

The memory 6200 may include the semiconductor device fabricated according to embodiments of the inventive concept described above with reference to FIGS. 1A to 8C.

The system 6000 may be used in mobile phones, MP3 players, navigation systems, portable multimedia players (PMPs), solid state disks (SSDs), or household appliances.

While the inventive concept has been particularly shown and described with reference to exemplary embodiments thereof, it will be understood that various changes in form and details may be made therein without departing from the spirit and scope of the following claims.

What is claimed:

1. A semiconductor device comprising:
a plurality of active regions including an upper surface having a short axis in a first direction and a long axis in a second direction, the plurality of active regions being repeatedly disposed along the first direction and along the second direction, and being spaced apart from each other; and
an isolation region defining the plurality of active regions,
wherein the isolation region including a first insulating layer being in contact with side walls of a short axis pair of active regions which are closest active regions in the first direction among the plurality of active regions, and continuously extending along a first shortest distance between the short axis pair of active regions.

2. The semiconductor device of claim 1, wherein the first insulating layer contacts side walls of a long axis pair of active regions which are closest active regions in the second direction among the plurality of active regions, and continuously extends along a second shortest distance between the long axis pair of active regions.

3. The semiconductor device of claim 1, wherein the isolation region is consisting of the first insulating layer.

4. The semiconductor device of claim 1, wherein the first insulating layer contacts side walls of a long axis pair of active regions which are closest active regions in the second direction among the plurality of active regions, and covers the side walls of the long axis pair of active regions by a first width in a second shortest distance between the long axis active regions, and
the first shortest distance is equal to or less than twice the first width, and the second shortest distance is greater than twice the first width.

5. The semiconductor device of claim 4, wherein the isolation region further comprises a second insulating layer having side walls and a lower surface, and being disposed in the second shortest distance, the side walls and a lower surface being surrounded by the first insulating layer.

6. The semiconductor device of claim 5, wherein the short axis pair of active regions are aligned to be shifted to the opposite directions along the second direction such that portions of the pair of first active regions overlap with each other along the first direction, and
the second insulating layer is not disposed between the short axis pair of active regions.

7. The semiconductor device of claim 5, wherein the first insulating layer is an oxide layer, and the second insulating layer is a nitride layer.

8. The semiconductor device of claim 5, the second insulating layer has a solid pillar shape filled with the same material as that forming the external surface of the second insulating layer.

9. The semiconductor device of claim 5, further comprising:
a word line extending to cross the second shortest distance; and
a gate dielectric film being interposed between the word line and the plurality of active regions,
wherein the second insulating layer faces a lower surface of the word line with the gate dielectric film interposed between the second insulating layer and the word line.

10. A semiconductor device comprising:
a substrate including a first region and second region having different active region densities from each other,
a plurality of first active regions in the first region, the plurality of first active regions including an upper surface having a short axis in a first direction and a long axis in a second direction, being repeatedly disposed along the first direction and along the second direction, and being spaced apart from each other,
a plurality of second active regions in the second region,
a first isolation region defining the plurality of first active regions in the first region, and
a second isolation region defining the plurality of second active regions in the second region, wherein the first isolation region comprises a first insulating layer being in contact with side walls of a short axis pair of first active regions which are closest first active regions in the first direction among the plurality of first active regions, and continuously extending along a first shortest distance between the short axis pair of first active regions, and the second isolation region comprises a trench insulating layer covering side walls of the plurality of second active regions, an insulating liner covering the trench insulating layer, and a gap-fill insulating layer on the insulating liner.

11. The semiconductor device of claim 10, wherein the first insulating layer, the trench insulating layer, and the gap-fill insulating layer are oxide layers, and the insulating liner is a nitride layer.

12. The semiconductor device of claim 10, wherein the thickness of the insulating liner is greater than the thickness of the trench insulating layer.

13. The semiconductor device of claim 10, wherein the first isolation region is consisting of the first insulating layer.

14. The semiconductor device of claim 10, wherein the first isolation region further comprises a second insulating layer having side walls and a lower surface, the side walls and the lower surface being surrounded by the first insulating layer, wherein the second insulating layer is disposed in a second shortest distance between a long axis pair of first active regions that are closest first active regions in the second direction among the plurality of first active regions, and wherein the second insulating layer is formed of the same material as the insulating liner.

15. The semiconductor device of claim 14, further comprising:

a buried word line formed in the first region; and a gate dielectric film interposed between the buried word line and the plurality of first active regions, wherein the second insulating layer faces a lower surface of the buried word line with the gate dielectric film interposed between the second insulating layer and the buried word line.

16. A semiconductor device comprising:

a substrate including a trench isolation material therein in a cell array region of the device and in a peripheral/core region of the device; and a plurality of active regions spaced apart from one another in the substrate and separated from one another by the trench isolation material, each active region having opposite short axis side walls and opposite long axis side walls, wherein closest portions of facing long axis side walls of directly adjacent ones of the active regions directly contact the trench isolation material and wherein the peripheral/core region includes the trench isolation material with a trench isolation liner material thereon.

17. The device of claim 16 wherein closest portions of facing short axis side walls of directly adjacent ones of the active regions directly contact the trench isolation material and are separated from one another by a trench liner material surrounded by the trench isolation material contacting the facing short axis side walls.

18. The device of claim 17 wherein the trench isolation material comprises an oxide material and the trench liner material comprises a nitride material.

19. The device of claim 16 wherein the trench isolation material in the peripheral/core region comprises an oxide material and the trench isolation liner material comprises SiN material, the peripheral/core region further comprising:

a Tonen SilaZene structure on the trench isolation liner material opposite the oxide material, wherein a total thickness of the SiN material is greater than a total thickness of the oxide material.

20. The device of claim 16 wherein the trench isolation material in the peripheral/core region comprises an oxide material having a total thickness that is greater than half a distance separating directly adjacent facing long axis side walls of the plurality of active regions.

* * * * *